(12) United States Patent
Yang et al.

(10) Patent No.: US 8,962,985 B2
(45) Date of Patent: Feb. 24, 2015

(54) SOLAR CELL AND SOLAR CELL MODULE

(75) Inventors: Youngsung Yang, Seoul (KR); Myungjun Shin, Seoul (KR); Minho Choi, Seoul (KR); Seongeun Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 276 days.

(21) Appl. No.: 13/455,721

(22) Filed: Apr. 25, 2012

(65) Prior Publication Data

US 2012/0291839 A1    Nov. 22, 2012

(30) Foreign Application Priority Data

May 20, 2011   (KR) .................. 10-2011-0048071

(51) Int. Cl.
*H01L 31/068* (2012.01)
*H01L 31/0224* (2006.01)

(52) U.S. Cl.
CPC ... *H01L 31/022433* (2013.01); *H01L 31/022425* (2013.01); *H01L 31/068* (2013.01); *Y02E 10/547* (2013.01)
USPC ......................................... 136/256; 136/243

(58) Field of Classification Search
CPC ............... H01L 31/022441–31/022458; H01L 31/0516; H01L 31/0682
USPC ................................................. 136/243–265
See application file for complete search history.

(56) References Cited

U.S. PATENT DOCUMENTS

| | | | | |
|---|---|---|---|---|
| 2010/0200057 | A1* | 8/2010 | Miyake et al. | 136/256 |
| 2010/0218811 | A1* | 9/2010 | Echizenya et al. | 136/252 |
| 2010/0224228 | A1 | 9/2010 | Kim et al. | |
| 2010/0275965 | A1 | 11/2010 | Lee et al. | |
| 2011/0011440 | A1* | 1/2011 | Hioki et al. | 136/244 |

FOREIGN PATENT DOCUMENTS

| | | |
|---|---|---|
| EP | 2 180 522 A1 | 4/2010 |
| EP | 2 302 690 A1 | 3/2011 |
| EP | 2 317 566 A2 | 5/2011 |
| JP | 2005184025 A | 7/2005 |
| JP | 2006-147997 A | 6/2006 |
| JP | 2006-210654 A | 8/2006 |
| JP | 2008-159997 | 7/2008 |
| JP | 2009-64840 A | 3/2009 |
| WO | 2007001004 A1 | 1/2007 |

* cited by examiner

*Primary Examiner* — Bach Dinh
(74) *Attorney, Agent, or Firm* — McKenna Long & Aldridge LLP

(57) ABSTRACT

A solar cell includes a semiconductor substrate, an emitter region positioned at the semiconductor substrate, a first electrode which is positioned on the semiconductor substrate and is connected to the emitter region, a second electrode which is positioned on the semiconductor substrate and is connected to the semiconductor substrate, and a second electrode current collector which is positioned on the semiconductor substrate and is connected to the second electrode. An overlap distance between the second electrode and the second electrode current collector in a first direction corresponding to an extension direction of a conductive film positioned on the second electrode current collector is less than an overlap distance between the second electrode and the second electrode current collector in a second direction crossing the first direction.

16 Claims, 19 Drawing Sheets

SOLAR CELL AND SOLAR CELL MODULE

This application claims priority to and the benefit of Korean Patent Application No. 10-2011-0048071, filed in the Korean Intellectual Property Office on May 20, 2011, the entire contents of which are incorporated herein by reference.

BACKGROUND

1. Field of the Disclosure

The disclosure relates to a solar cell and a solar cell module.

2. Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type and thus form a p-n junction, and electrodes respectively connected to the semiconductor parts of the different conductive types.

When light is incident on the solar cell, carriers including electrons and holes are produced in the semiconductor parts. The carriers move to the n-type semiconductor part and the p-type semiconductor part under the influence of the p-n junction. Namely, the electrons move to the n-type semiconductor part, and the holes move to the p-type semiconductor part. Then, the electrons and the holes are collected by the different electrodes respectively connected to the n-type semiconductor part and the p-type semiconductor part. The electrodes are connected to each other using electric wires to thereby obtain electric power.

SUMMARY

In one aspect, there is a solar cell including a semiconductor substrate, an emitter region which is positioned at the semiconductor substrate and forms a p-n junction along with the semiconductor substrate, a first electrode which is positioned on the semiconductor substrate and is connected to the emitter region, a second electrode which is positioned on the semiconductor substrate and is connected to the semiconductor substrate, and a second electrode current collector which is positioned on the semiconductor substrate and is connected to the second electrode. An overlap distance between the second electrode and the second electrode current collector in a first direction corresponding to an extension direction of a conductive film positioned on the second electrode current collector may be less than an overlap distance between the second electrode and the second electrode current collector in a second direction crossing the first direction.

The second electrode may have at least one opening in which a portion of the second electrode current collector is positioned. The conductive film may be positioned on the second electrode current collector exposed through the at least one opening.

The second electrode current collector may include a plurality of conductors which are separated from one another and parallel to one another along a virtue line extending along the second electrode current collector.

Among a plurality of openings, a portion of at least one conductor of the plurality of conductors may be positioned in a corresponding opening and may be exposed through the corresponding opening.

An edge portion of the at least one conductor of the plurality of conductors may include a first portion overlapping the second electrode in the first direction and a second portion overlapping the second electrode in the second direction. An overlap distance between the second electrode and the first portion may be less than an overlap distance between the second electrode and the second portion.

The overlap distance between the second electrode and the first portion may be about 0.25 mm, and the overlap distance between the second electrode and the second portion may be about 0.5 mm.

An edge portion of the at least one conductor of the plurality of conductors may include a first portion overlapping the second electrode in the second direction and a second portion which does not overlap the second electrode in the first direction and is separated from or abuts the second electrode in the first direction.

A distance between an end of the second portion and an end of the second electrode adjacent to the end of the second portion may be equal to or less than about 0.25 μm.

An overlap distance between the second electrode and the first portion may be about 0.25 mm to 0.5 mm.

The at least one conductor of the plurality of conductors may have a plurality of first branches which are separated from one another and protrude in the second direction. The second electrode may overlap the plurality of first branches.

The at least one conductor of the plurality of conductors may further have a plurality of second branches which are separated from one another and protrude in the first direction. The second electrode may overlap the plurality of second branches.

A length of the plurality of first branches may be longer than a length of the plurality of second branches.

A width of the plurality of first branches may be equal to or greater than a width of the plurality of second branches.

The second electrode current collector may have a stripe shape elongating along a virtue line extending along the second electrode current collector.

An edge portion of the second electrode current collector of the stripe shape may include a first portion overlapping the second electrode in the first direction and a second portion overlapping the second electrode in the second direction. An overlap distance between the second electrode and the first portion may be less than an overlap distance between the second electrode and the second portion.

The overlap distance between the second electrode and the first portion may be about 0.25 mm, and the overlap distance between the second electrode and the second portion may be about 0.5 mm.

An edge portion of the second electrode current collector of the stripe shape may include a first portion overlapping the second electrode in the second direction and a second portion which does not overlap the second electrode in the first direction and is separated from or abuts the second electrode in the first direction.

a distance between an end of the second portion and an end of the second electrode adjacent to the end of the second portion may be equal to or less than about 0.25 μm.

An overlap distance between the second electrode and the first portion may be about 0.25 mm to 0.5 mm.

The second electrode current collector of the stripe shape may have a plurality of first branches which are separated from one another and protrude in the second direction. The second electrode may overlap the plurality of first branches.

The second electrode current collector of the stripe shape may further have a plurality of second branches which are separated from one another and protrude in the first direction. The second electrode may overlap the plurality of second branches.

A length of the plurality of first branches may be longer than a length of the plurality of second branches.

A width of the plurality of first branches may be equal to or greater than a width of the plurality of second branches.

The second electrode current collector may be positioned directly on the semiconductor substrate. A portion of the second electrode may be positioned on a portion of the second electrode current collector and may overlap the portion of the second electrode current collector.

A portion of the second electrode current collector may be positioned on a portion of the second electrode positioned directly on the semiconductor substrate and may overlap the portion of the second electrode.

In another aspect, there is a solar cell module including first and second solar cells each including a substrate, an emitter region positioned at the substrate, a plurality of first electrodes which are positioned on a first surface of the substrate and are connected to the emitter region, a first electrode current collector which is positioned on the first surface of the substrate and are connected to the plurality of first electrodes, a second electrode which is positioned on a second surface of the substrate opposite the first surface and is connected to the substrate, a second electrode current collector which is positioned on the second surface of the substrate and is connected to the second electrode; and a conductive film which is positioned on the first electrode current collector positioned on the first solar cell and on the second electrode current collector positioned on the second solar cell in a first direction corresponding to an extension direction of the first and second electrode current collectors and connects the first and second solar cells to each other. the first and second electrode current collectors of each of the first and second solar cells extend in the first direction, and the plurality of first electrodes of each of the first and second solar cells extend in a second direction crossing the first direction. An overlap distance between the second electrode and the second electrode current collector of each of the first and second solar cells in the first direction is less than an overlap distance between the second electrode and the second electrode current collector of each of the first and second solar cells in the second direction.

According to the above-described characteristics, the overlap area between the second electrode and the second electrode current collector in the extension direction of the conductive film decreases in the process for attaching the conductive film to the second electrode current collector, and thus the poor contact between the second electrode current collector and the conductive film is reduced or prevented. Hence, a defect rate of the solar cells is reduced, and an amount of carriers output from the second electrode current collector to the conductive film increases. As a result, the efficiency of the solar cell is improved.

BRIEF DESCRIPTION OF THE DRAWINGS

The accompanying drawings, which are included to provide a further understanding of the disclosure and are incorporated in and constitute a part of this specification, illustrate embodiments of the invention and together with the description serve to explain the principles of the invention. In the drawings.

DETAILED DESCRIPTION OF THE EMBODIMENTS

Figure 1:
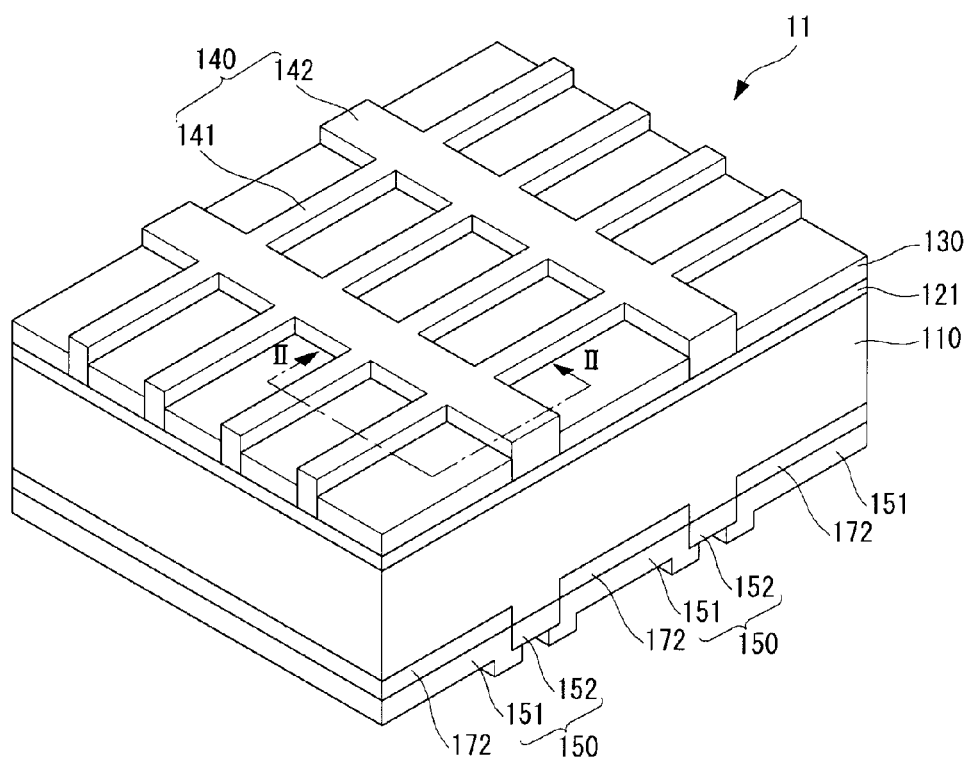
FIG. 1 is a partial perspective view of a solar cell according to an exemplary embodiment of the invention.

Embodiments of the invention will be described more fully hereinafter with reference to the accompanying drawings, in which exemplary embodiments of the invention are shown. This invention may, however, be embodied in many different forms and should not be construed as limited to the embodiments set forth herein.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Exemplary embodiments of the invention will be described with reference to FIGS. 1 to 20.

A solar cell according to an exemplary embodiment of the invention is described in detail with reference to FIGS. 1 to 12.

Figure 2:
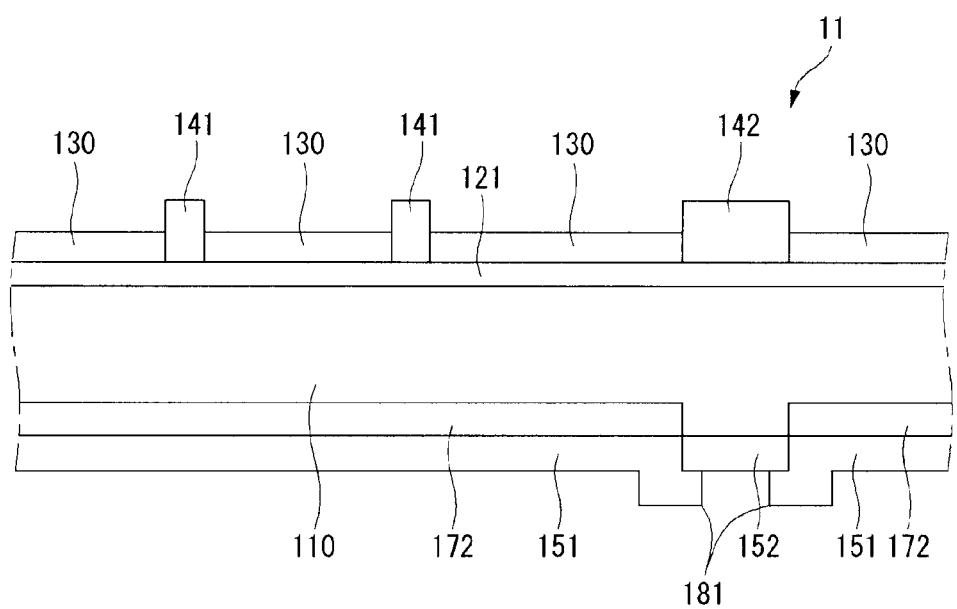
FIG. 2 is a cross-sectional view taken along line II-II of FIG. 1.

As shown in FIGS. 1 and 2, a solar cell 11 according to an embodiment of the invention includes a substrate 110, an emitter region 121 positioned at an incident surface (hereinafter, referred to as "a front surface") of the substrate 110 on which light is incident, an anti-reflection layer 130 positioned on the emitter region 121, a front electrode part 140 which is positioned on the emitter region 121 and includes a plurality of front electrodes 141 and at least one front electrode current collector 142 connected to the plurality of front electrodes 141, a back surface field (BSF) region 172 positioned at a surface (hereinafter, referred to as "a back surface") opposite the incident surface of the substrate 110, and a back electrode part 150 which is positioned on the BSF region 172 and the back surface of the substrate 110 and includes a back electrode 151 and at least one back electrode current collector 152 connected to the back electrode 151.

The substrate 110 is a semiconductor substrate formed of a semiconductor such as first conductive type silicon, for example, p-type silicon, though not required. The semiconductor used in the substrate 110 is a crystalline semiconductor, such as single crystal silicon or polycrystalline silicon.

When the substrate 110 is of the p-type, the substrate 110 may be doped with impurities of a group III element such as boron (B), gallium (Ga), and indium (In). Alternatively, the substrate 110 may be of an n-type and/or may be formed of a semiconductor material other than silicon. If the substrate 110 is of the n-type, the substrate 110 may be doped with impurities of a group V element such as phosphorus (P), arsenic (As), and antimony (Sb).

A texturing process may be performed on the flat front surface of the substrate 110 to form a textured surface corresponding to an uneven surface having a plurality of protrusions and a plurality of depressions or having uneven characteristics. In this instance, the anti-reflection layer 130 on the front surface of the substrate 110 may have the textured surface.

If the front surface of the substrate 110 has the textured surface, a surface area of the substrate 110 may increase and an incident area of light may increase. Hence, an amount of light reflected from the substrate 110 may decrease, and an amount of light incident on the substrate 110 may increase.

When light is incident on the substrate 110, electrons and holes are generated by energy produced by the incident light.

The emitter region 121 positioned at the front surface of the substrate 110 is an impurity doped region doped with impurities of a second conductive type (for example, n-type) opposite the first conductive type (for example, p-type) of the substrate 110. Thus, the emitter region 121 of the second conductive type forms a p-n junction along with a first conductive type region (for example, a p-type region) of the substrate 110.

In carriers, for example, electrons and holes are produced by light incident on the substrate 110, and the electrons and the holes respectively move to the n-type semiconductor and the p-type semiconductor by a built-in potential difference resulting from the p-n junction between the substrate 110 and the emitter region 120. Thus, when the substrate 110 is of the p-type and the emitter region 120 is of the n-type, the holes and the electrons move to the substrate 110 and the emitter region 120, respectively.

Because the emitter region 121 forms the p-n junction along with the first conductive type region of the substrate 110, the emitter region 121 may be of the p-type when the substrate 110 is of the n-type in another embodiment of the invention. In this instance, the electrons move to the substrate 110 and the holes move to the emitter region 121.

Returning to the embodiment of the invention, when the emitter region 121 is of the n-type, the emitter region 121 may be formed by doping the substrate 110 with impurities of a group V element. On the contrary, when the emitter region 121 is of the p-type, the emitter region 121 may be doped with impurities of a group III element.

The anti-reflection layer 130 positioned on the emitter region 121 may be formed of a material which does not reflect light and can transmit light toward the substrate 110. For example, the anti-reflection layer 130 may be formed of hydrogenated silicon nitride (SiNx:H), hydrogenated silicon oxide (SiOx:H), hydrogenated silicon oxynitride (SiOxNy:H), etc.

The anti-reflection layer 130 reduces a reflectance of light incident on the solar cell 11 and increases selectivity of a predetermined wavelength band, thereby increasing an amount of light incident on the substrate 110. Hence, the efficiency of the solar cell 11 is improved.

The anti-reflection layer 130 performs a passivation function which converts a defect, for example, dangling bonds existing at and around the surface of the substrate 110 into stable bonds using hydrogen (H) injected into the anti-reflection layer 130 in the formation process of the anti-reflection layer 130 to thereby prevent or reduce a recombination and/or a disappearance of carriers moving to the surface of the substrate 110. Hence, the anti-reflection layer 130 reduces an amount of carriers lost by the defect at and around the surface of the substrate 110. As a result, the efficiency of the solar cell 11 is improved.

In the embodiment of the invention, the anti-reflection layer 130 has a single-layered structure, but may have a multi-layered structure, for example, a double-layered structure. Further, the anti-reflection layer 130 may be omitted, if necessary or desired.

The plurality of front electrodes 141 of the front electrode part 140 are connected to the emitter region 121. The plurality of front electrodes 141 are separated from one another and extend parallel to one another in a fixed direction. The plurality of front electrodes 141 collect carriers (for example, electrons) moving to the emitter region 121.

The at least one front electrode current collector 142 of the front electrode part 140 is connected to the emitter region 121 and extends parallel to one another in a direction crossing the front electrodes 141.

The front electrode current collector 142 is positioned on the same level layer as the front electrodes 141. The front electrode current collector 142 is electrically and physically connected to the front electrodes 141 at crossings of the front electrodes 141 and the front electrode current collector 142.

Accordingly, as shown in FIG. 1, the plurality of front electrodes 141 have a stripe shape extending in a transverse or longitudinal direction, and the at least one front electrode current collector 142 has a stripe shape extending in a longitudinal or transverse direction. Hence, the front electrode part 140 has a lattice shape on the front surface of the substrate 110.

The front electrode current collector 142 has to collect not only carriers (for example, electrons) moving from the emitter region 121 but also carriers collected by the front electrodes 141 crossing the front electrode current collector 142 and then has to transfer the collected carriers in a desired direction. Therefore, a width of the front electrode current collector 142 is greater than a width of each front electrode 141.

The front electrode current collector 142 is connected to an external device (not shown) and outputs collected carriers to the external device.

A conductive film, for example, a ribbon connected to the external device is attached to the front electrode current collector 142. Hence, carriers (for example, electrons) collected by the front electrode current collector 142 are output to the external device through the conductive film.

The front electrode part 140 including the plurality of front electrodes 141 and the front electrode current collector 142 is formed of at least one conductive material, for example, silver (Ag).

In the embodiment of the invention, the number of front electrodes 141 and the number of front electrode current collectors 142 may vary, if necessary.

The BSF region 172 is a region (for example, a $p^+$-type region) that is more heavily doped than the substrate 110 with impurities of the same conductive type as the substrate 110.

A potential barrier is formed by a difference between impurity concentrations of the first conductive type region of the substrate 110 and the BSF region 172, thereby preventing electrons from moving to the BSF region 172 used as a moving path of holes and making it easier for holes to move to the BSF region 172. Thus, the BSF region 172 reduces an amount of carriers lost by a recombination and/or a disappearance of the electrons and the holes at and around the back surface of the substrate 110 and accelerates a movement of desired carriers (for example, holes), thereby increasing the movement of carriers to the back electrode part 150.

Because the BSF region 172 is formed at the back surface of the substrate 110 contacting the back electrode 151, a formation area of the BSF region 172 changes depending on a formation area of the back electrode 151. For example, as the formation area of the back electrode 151 increases, the formation area of the BSF region 172 increases.

The back electrode 151 of the back electrode part 150 contacts the BSF region 172 positioned at the back surface of the substrate 110 and is substantially positioned on the entire back surface of the substrate 110 except a formation area of the back electrode current collector 152. In this instance, as shown in FIGS. 4 to 12, the back electrode 151 is not positioned at an edge portion of the back surface of the substrate 110. Alternatively, the back electrode 151 may be positioned even in the edge portion of the back surface of the substrate 110.

The back electrode 151 may contain a conductive material different from the front electrode part 140. For example, the back electrode 151 may contain aluminum (Al).

The back electrode 151 collects carriers (for example, holes) moving from the BSF region 172.

Because the back electrode 151 contacts the BSF region 172, which has the impurity concentration higher than the substrate 110 and conductivity greater than the substrate 110, a contact resistance between the substrate 110 (i.e., the BSF region 172) and the back electrode 151 decreases. Hence, the transfer efficiency of carriers from the substrate 110 to the back electrode 151 is improved.

Figure 3:
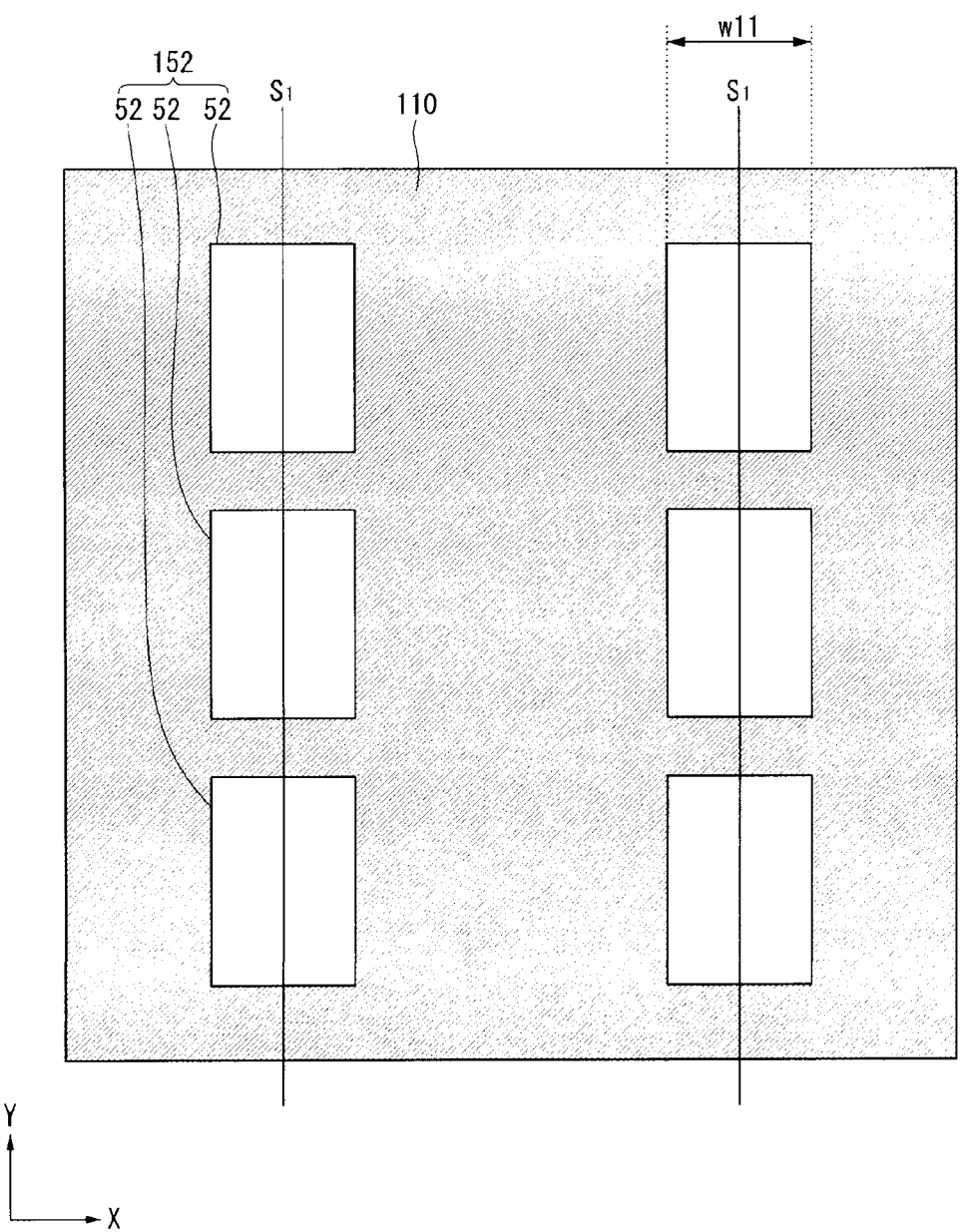
FIG. 3 is a schematic plane view of a conductor of a back electrode current collector according to an exemplary embodiment of the invention.

As shown in FIG. 3, the back electrode current collector 152 has an island shape, unlike the front electrode current collector 142. Therefore, the back electrode current collector 152 has a plurality of conductors 52. The plurality of conductors 52 are separated from one another and are positioned parallel to one another on the back surface of the substrate 110 along one virtual line S1 extending in an extension direction (for example, a Y-axis direction parallel to one side of the substrate 110) of the back electrode current collector 152. The virtual line S1 may extend along the middle of the plurality of conductors 52.

At least a portion of an edge portion of each conductor 52 overlaps the back electrode 151 and is connected to the back electrode 151. Hence, the back electrode 151 has a plurality of openings 181 exposing a portion of each conductor 52. Namely, a remaining portion of each conductor 52 not overlapping the back electrode 151 is positioned in each opening 181.

As shown in FIGS. 4 to 11, because the back electrode 151 is positioned between the adjacent conductors 52, a formation area of the back electrode 151 when the back electrode current collector 152 has the island shape is greater than a formation area of the back electrode 151 when the back electrode current collector 152 has a stripe shape elongating in a predetermined direction in the same manner as the front electrode current collector 142.

As described above, because the formation area of the back electrode 151 increases, a formation area of the BSF region 172 contacting the back electrode 151 increases. Hence, the BSF region 172 further reduces an amount of carriers lost by the recombination and/or the disappearance of electrons and holes at and around the back surface of the substrate 110. As a result, the efficiency of the solar cell 11 further increases.

Similar to the front electrode current collector 142, the back electrode current collector 152 collects carriers transferred from the back electrode 151.

As shown in FIGS. 4 to 12, a conductive film 71 is attached to the back electrode current collector 152 in the same manner as the front electrode current collector 142. Thus, carriers (for example, holes) collected by the back electrode current collector 152 are output to the external device through the conductive film 71.

The plurality of conductors 52 are formed of a material different from the back electrode 151. For example, the conductors 52 contain a material which is easily attached to the conductive film 71. Thus, an adhesive strength between the conductive film 71 and the conductors 52 is greater than an adhesive strength between the conductive film 71 and the back electrode 151.

In the embodiment of the invention, the conductive film 71 contains silver (Ag), and the plurality of conductors 52 contain silver (Ag).

As described above, because the conductors 52 constituting the back electrode current collector 152 are formed of the material much more expensive than the back electrode 151, the formation area of the back electrode 151 increases instead of the back electrode current collector 152. Hence, the formation area of the BSF region 172 contacting the back electrode 151 increases. As a result, the efficiency of the solar cell 11 is improved, and the manufacturing cost of the solar cell 11 is greatly reduced.

Accordingly, because the back electrode current collector 152 does not elongate in stripe shape and includes the plurality of conductors 52 which are spaced apart from one another at a predetermined distance therebetween, the formation area of the back electrode current collector 152 greatly decreases by a sum of distances between the conductors 52. As a result, an amount of the material, for example, silver (Ag) used for the back electrode current collector 152 decreases, and the manufacturing cost of the solar cell 11 is reduced.

A connection configuration between each conductor 52 of the back electrode current collector 152 and the back electrode 151 is described below with reference to FIGS. 4 to 11.

Figure 4:
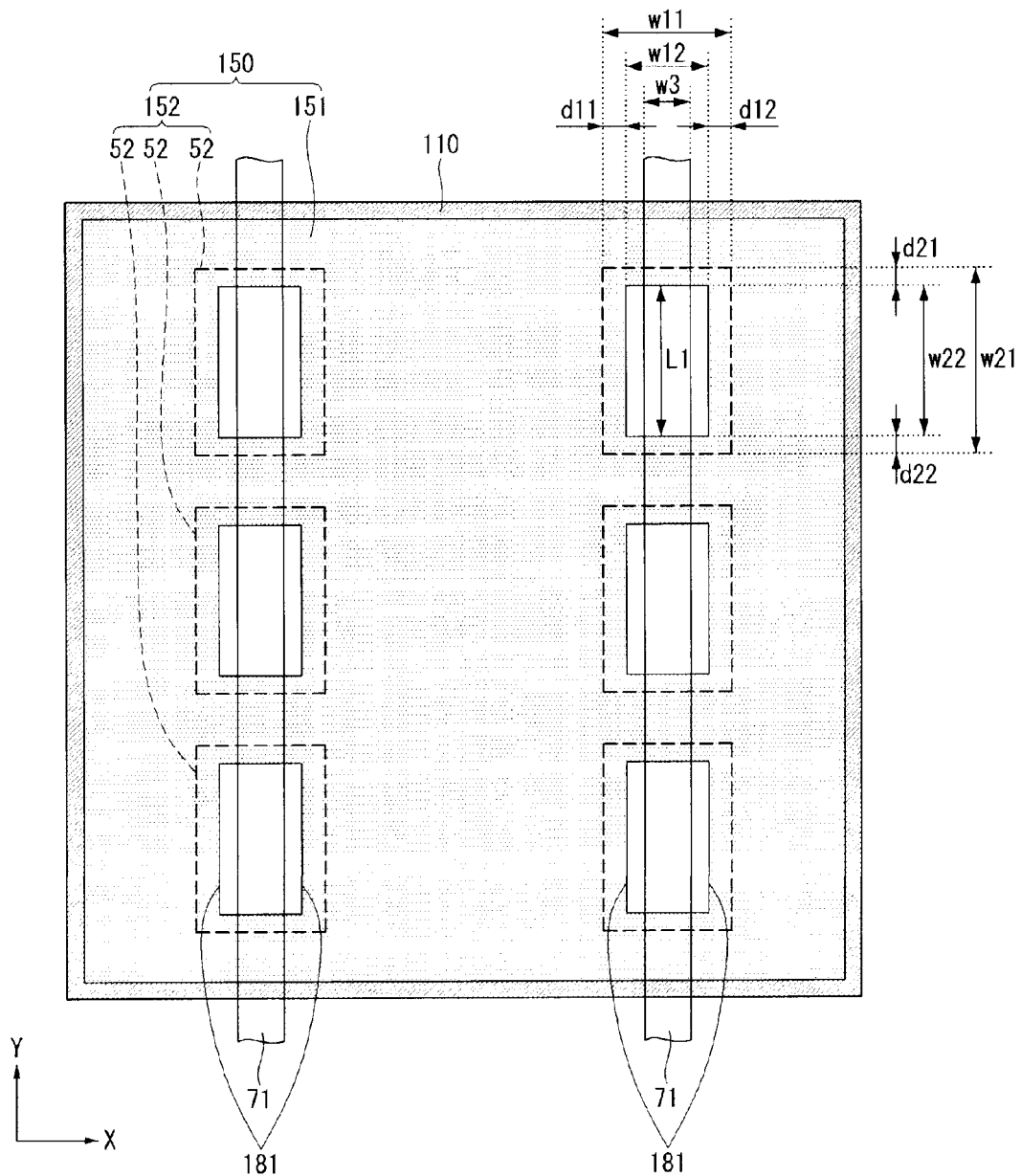
FIGS. 4 to 12 illustrate various overlap examples between a back electrode and a conductor of a back electrode current collector in a solar cell according to an exemplary embodiment of the invention.

As shown in FIG. 4, the conductor 52 overlaps the back electrode 151 in the Y-axis direction (for example, a first direction) and an X-axis direction (for example, a second direction). In the embodiment of the invention, the X-axis direction and the Y-axis direction cross each other and are perpendicular to each other. Further, the Y-axis direction is the extension direction of the back electrode current collector 152 or an extension direction of the conductive film 71, and the X-axis direction is a direction crossing the Y-axis direction. In other words, the conductor 52 overlaps the back electrode 151 in the X-axis direction parallel to one side of the substrate 110. In this instance, a left edge portion of the conductor 52 overlaps the back electrode 151 by a first overlap distance d11, and a right edge portion of the conductor 52 overlaps the back electrode 151 by a second overlap distance d12. Further, the conductor 52 overlaps the back electrode 151 in the Y-axis direction. In this instance, an upper edge portion of the conductor 52 overlaps the back electrode 151 by a third overlap distance d21, and a lower edge portion of the conductor 52 overlaps the back electrode 151 by a fourth overlap distance d22. As a result, the conductor 52 overlaps the back electrode 151 by the first to fourth overlap distances d11, d12, d21, and d22 respectively extending from ends of the left, right, upper, and lower edge portions of the conductor 52 toward the middle of the conductor 52.

In the embodiment of the invention, an overlap distance (for example, the first to fourth overlap distances d11, d12, d21, and d22) between the conductor 52 and the back electrode 151 is a maximum overlap distance between the corresponding edge portion (for example, the lower edge portion) of the conductor 52 parallel to one side of the substrate 110 and the back electrode 151.

In the configuration illustrated in FIG. 4, the overlap distances, i.e., the first and second overlap distances d11 and d12 in the X-axis direction are substantially equal to each other. Further, the overlap distances, i.e., the third and fourth overlap distances d21 and d22 in the Y-axis direction are substantially equal to each other.

At least one of the first and second overlap distances d11 and d12 is greater than at least one of the third and fourth overlap distances d21 and d22. Further, an average distance of the first and second overlap distances d11 and d12 may be greater than an average distance of the third and fourth overlap distances d21 and d22. Hence, a difference between a width w11 of the conductor 52 and a width w12 of the opening 181 in the X-axis direction is greater than a difference between a width w21 of the conductor 52 and a width w22 of the opening 181 in the Y-axis direction. Thus, an overlap area (for example, an overlap area in the upper and lower edge portions of the conductor 52) of the conductor 52 and the back electrode 151, which is positioned in the X-axis direction crossing the same direction (i.e., the Y-axis direction corresponding to the extension direction of the back electrode current collector 152 or the extension direction of the conductive film 71) as the virtual line S1 and prevents the extension of the conductive film 71, is less than an overlap area in the left and right edge portions of the conductor 52, as compared to the configuration in which the back electrode 151 overlaps the conductor 52 by the same overlap distance (or the same average overlap distance) in the X-axis and Y-axis directions.

Figure 5:
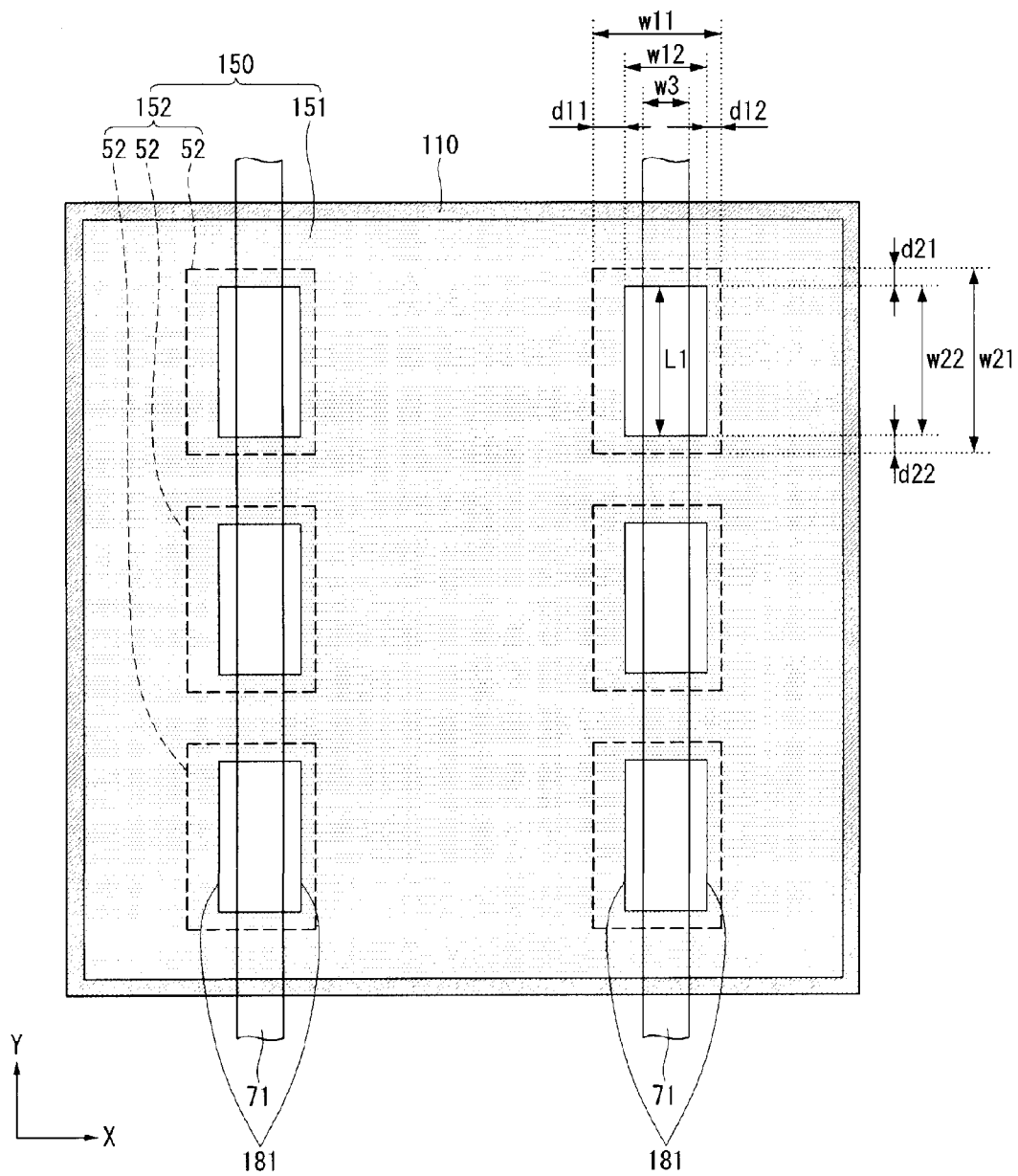

In the configuration illustrated in FIG. 5, a portion of the conductor 52 overlaps the back electrode 151 in the X-axis direction and the Y-axis direction in the same manner as FIG. 4. When the conductor 52 overlaps the back electrode 151 in the X-axis direction, an overlap distance between the left edge portion of the conductor 52 and the back electrode 151 is different from an overlap distance between the right edge portion of the conductor 52 and the back electrode 151.

For example, as shown in FIG. 5, an overlap distance d11 between the left edge portion of the conductor 52 and the back electrode 151 is greater than an overlap distance d12 between the right edge portion of the conductor 52 and the back electrode 151. Alternatively, the overlap distance d11 between the left edge portion of the conductor 52 and the back electrode 151 may be less than the overlap distance d12 between the right edge portion of the conductor 52 and the back electrode 151.

Further, as shown in FIG. 5, an overlap distance d21 between the upper edge portion of the conductor 52 and the back electrode 151 is substantially equal to an overlap distance d22 between the lower edge portion of the conductor 52 and the back electrode 151. Alternatively, the overlap distance d21 between the upper edge portion of the conductor 52 and the back electrode 151 may be different from the overlap distance d22 between the lower edge portion of the conductor 52 and the back electrode 151.

According to the configurations illustrated in FIGS. 4 and 5, the overlap area between the upper edge portion of the conductor 52 and the back electrode 151 and the overlap area between the lower edge portion of the conductor 52 and the back electrode 151 in the formation area of the conductive film 71 is decreased.

Figure 6:
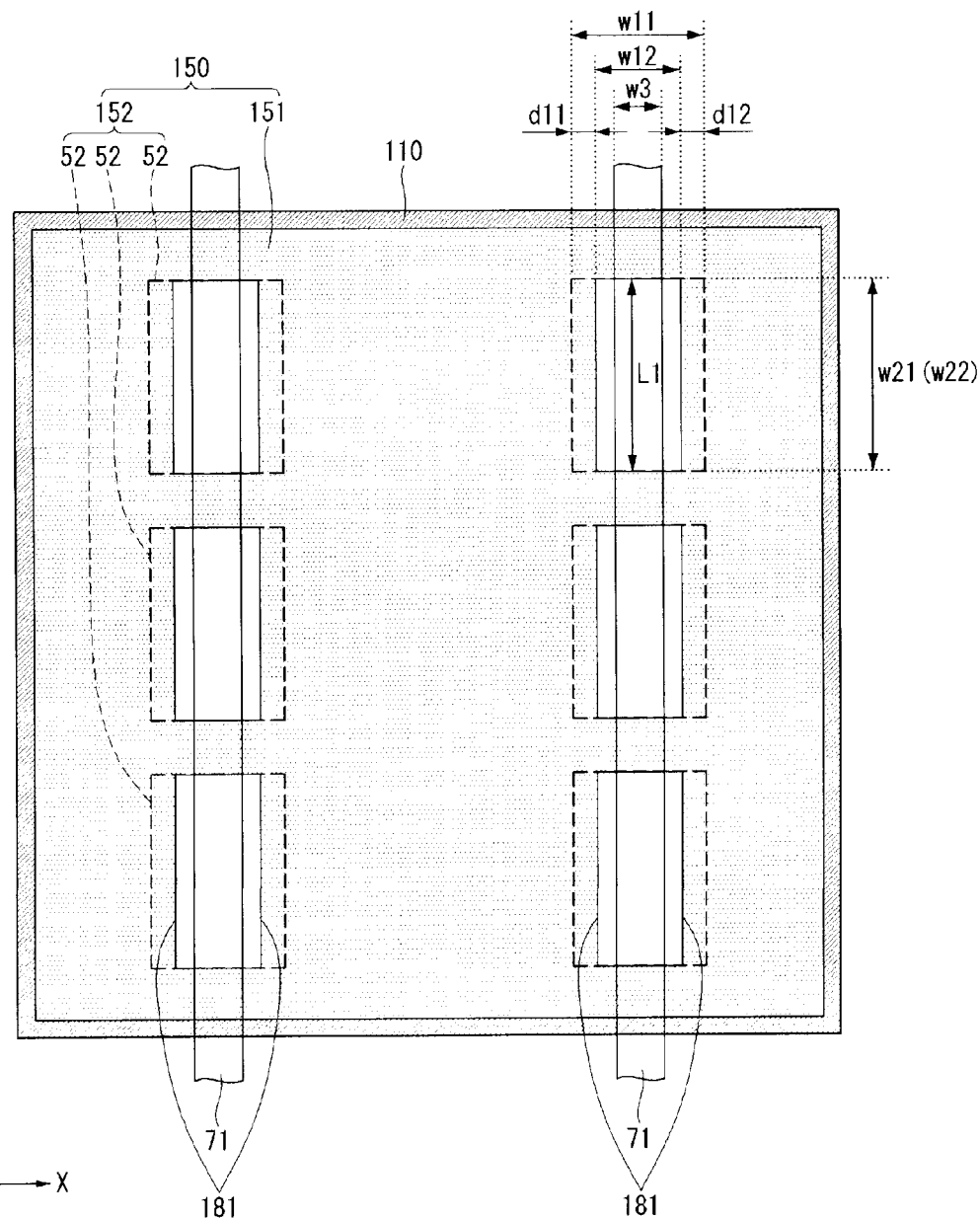

In the configuration illustrated in FIG. 6, the conductor 52 and the back electrode 151 overlap each other in the X-axis direction, but do not overlap each other in the Y-axis direction. Instead, the conductor 52 and the back electrode 151 abut each other in the Y-axis direction.

As shown in FIG. 6, an overlap distance d11 between the left edge portion of the conductor 52 and the back electrode 151 is substantially equal to an overlap distance d12 between the right edge portion of the conductor 52 and the back electrode 151. Alternatively, as described above with reference to FIG. 5, the overlap distance d11 between the left edge portion of the conductor 52 and the back electrode 151 may be different from the overlap distance d12 between the right edge portion of the conductor 52 and the back electrode 151. Thus, the overlap distance d11 between the left edge portion of the conductor 52 and the back electrode 151 may be greater or less than the overlap distance d12 between the right edge portion of the conductor 52 and the back electrode 151.

As described above, the upper end (i.e., the end of the upper edge portion) and the lower end (i.e., the end of the lower edge portion) of the conductor 52 abut an end of the back electrode 151 in the Y-axis direction without the overlap between them. Therefore, distances between the upper and lower ends of the conductor 52 and the end of the back electrode 151 abutting the upper and lower ends of the conductor 52 may be substantially zero.

According to the configuration illustrated in FIG. 6, a stepped portion between the upper edge portion of the conductor 52 and the back electrode 151 and a stepped portion between the lower edge portion of the conductor 52 and the back electrode 151 in the formation area of the conductive film 71 are not generated.

Figure 7:
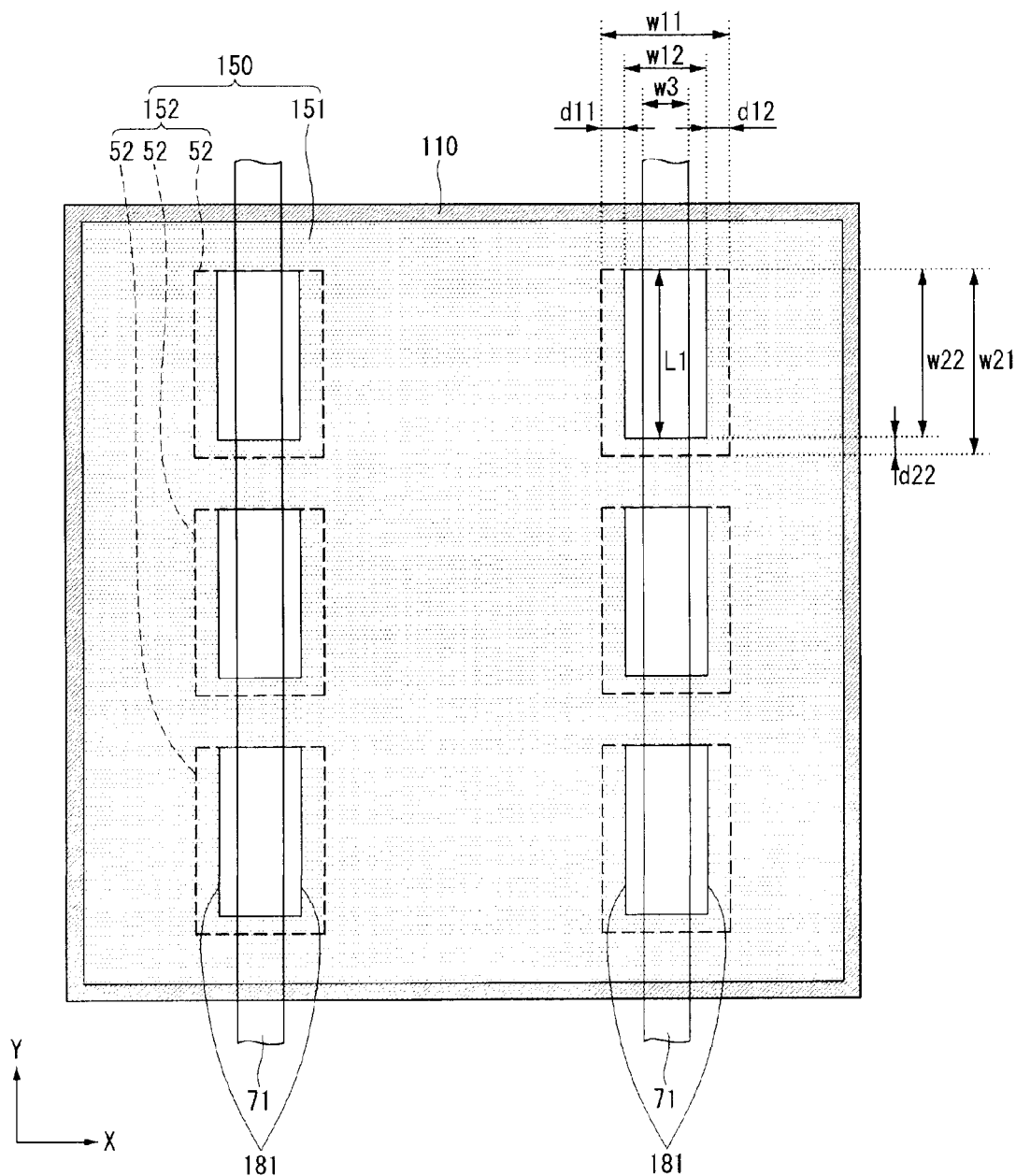

Unlike the configuration illustrated in FIG. 6, in the configuration illustrated in FIG. 7, one of the upper and lower edge portions of the conductor 52 overlaps the back electrode 151 by a predetermined overlap distance d22, and the end of the other edge portion does not overlap and abuts the end of the back electrode 151. In this instance, the conductor 52 overlaps the back electrode 151 in the X-axis direction, and an overlap distance d11 between the left edge portion of the conductor 52 and the back electrode 151 may be substantially equal to or different from an overlap distance d12 between the right edge portion of the conductor 52 and the back electrode 151.

According to the configuration illustrated in FIG. 7, a stepped portion between the upper edge portion of the conductor 52 and the back electrode 151 in the formation area of the conductive film 71 is not generated. Further, an overlap area between the lower edge portion of the conductor 52 and the back electrode 151 in the formation area of the conductive film 71 is decreased.

Figure 8:
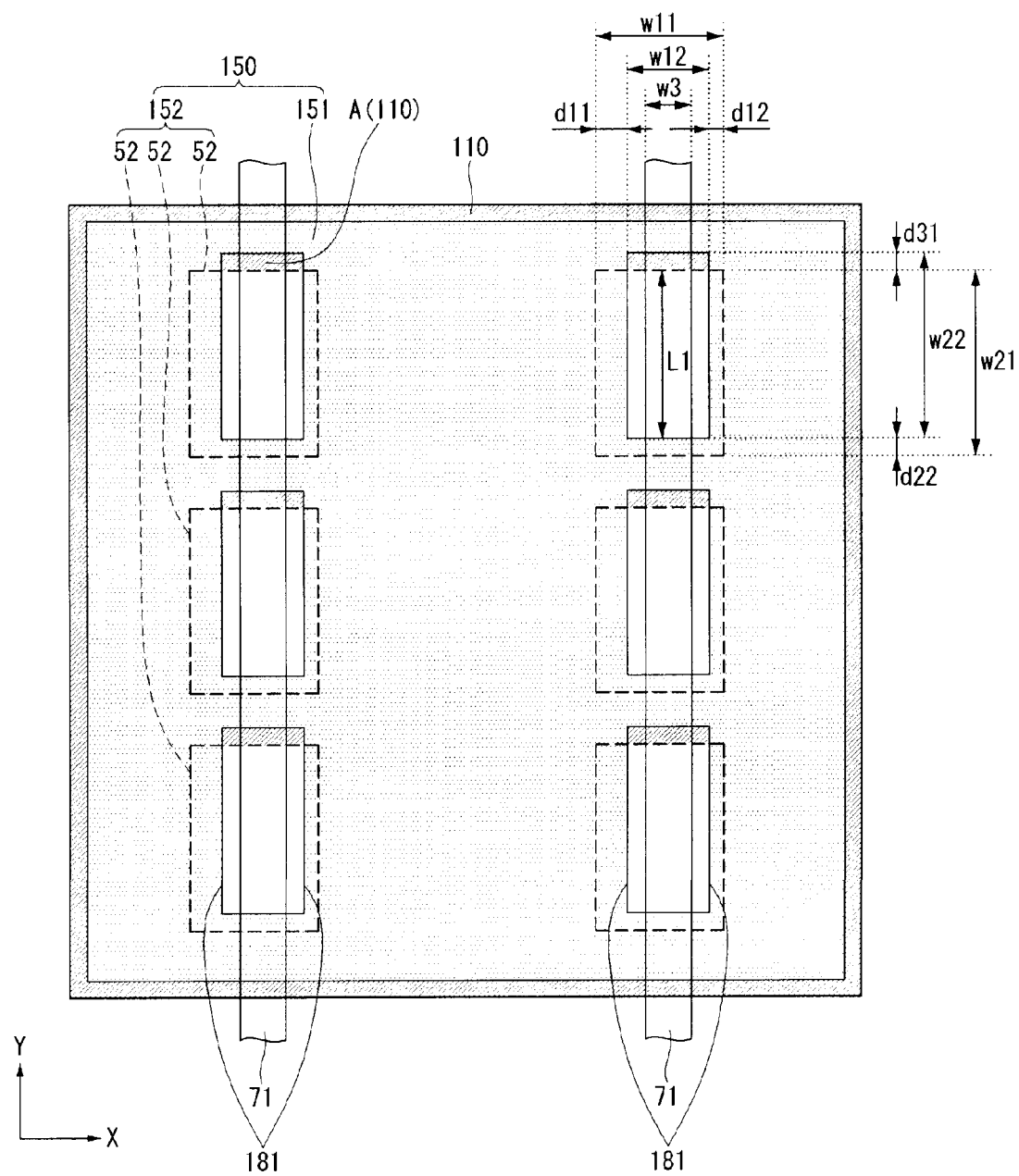

In the configuration illustrated in FIG. 8, the conductor 52 overlaps the back electrode 151 in the X-axis direction. Namely, the left edge portion of the conductor 52 overlaps the back electrode 151 by the first overlap distance d11, and the right edge portion of the conductor 52 overlaps the back electrode 151 by the second overlap distance d12. As shown in FIG. 8, the first overlap distance d11 may be greater than the second overlap distance d12. Alternatively, the first overlap distance d11 may be equal or less than the second overlap distance d12.

As shown in FIG. 8, the conductor 52 overlaps the back electrode 151 in the Y-axis direction. In this instance, one of the upper edge portion and the lower edge portion of the conductor 52 overlaps the back electrode 151, and the other edge portion is separated from the back electrode 151 in the Y-axis direction. Namely, the other edge portion does not overlap and does not abut the back electrode 151 in the Y-axis direction.

Thus, the back electrode 151 is not positioned between the end of the other edge portion (the upper edge portion in FIG. 8) of the conductor 52 not abutting the back electrode 151 and the end of the back electrode 151 adjacent to the upper end of the conductor 52. The conductor 52 has an exposing portion A exposing the back surface of the substrate 110 in the upper edge portion thereof.

A distance d31 of the exposing portion A between the upper end of the conductor 52 not abutting the back electrode 151 and the end of the back electrode 151 adjacent to the upper end may be equal to or less than about 0.25 µm.

When the distance d31 is equal to or less than about 0.25 µm, the formation area of the BSF region 172 is stably secured. Hence, the BSF region 172 may further prevent the recombination and/or the disappearance of electrons and holes.

According to the configuration illustrated in FIG. 8, a protrusion preventing the extension of the conductive film 71 is not generated in the upper edge portion of the conductor 52 in the extension area of the conductive film 71, and the overlap area between the lower edge portion of the conductor 52 and the back electrode 51 is decreased.

Figure 9:
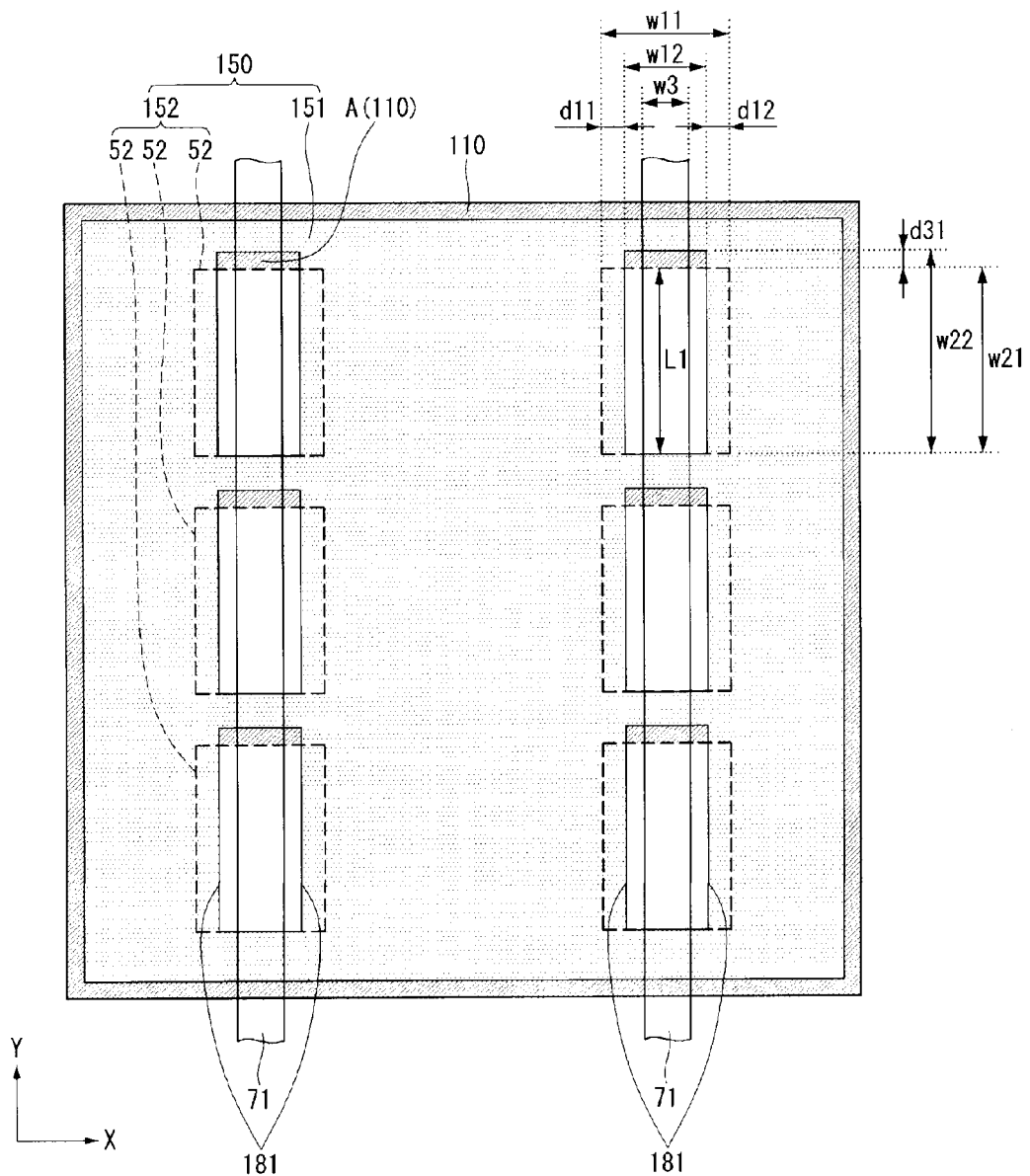

The configuration illustrated in FIG. 9 is different from the configuration illustrated in FIG. 8, in that one of the upper and lower edge portions of the conductor 52 does not overlap the back electrode 151 and abuts the corresponding end of the back electrode 151, and the other edge portion does not abut and does not overlap the back electrode 151. Thus, the exposing portion A exposing the back surface of the substrate 110 is formed between the end of one (the upper edge portion in FIG. 9) of the upper and lower edge portions of the conductor 52 and the end of the back electrode 151 adjacent to the upper end of the conductor 52.

According to the configuration illustrated in FIG. 9, a protrusion preventing the extension of the conductive film 71 is not generated in the upper edge portion of the conductor 52 in the extension area of the conductive film 71, and a stepped portion is not generated between the lower edge portion of the conductor 52 and the back electrode 151.

Figure 10:
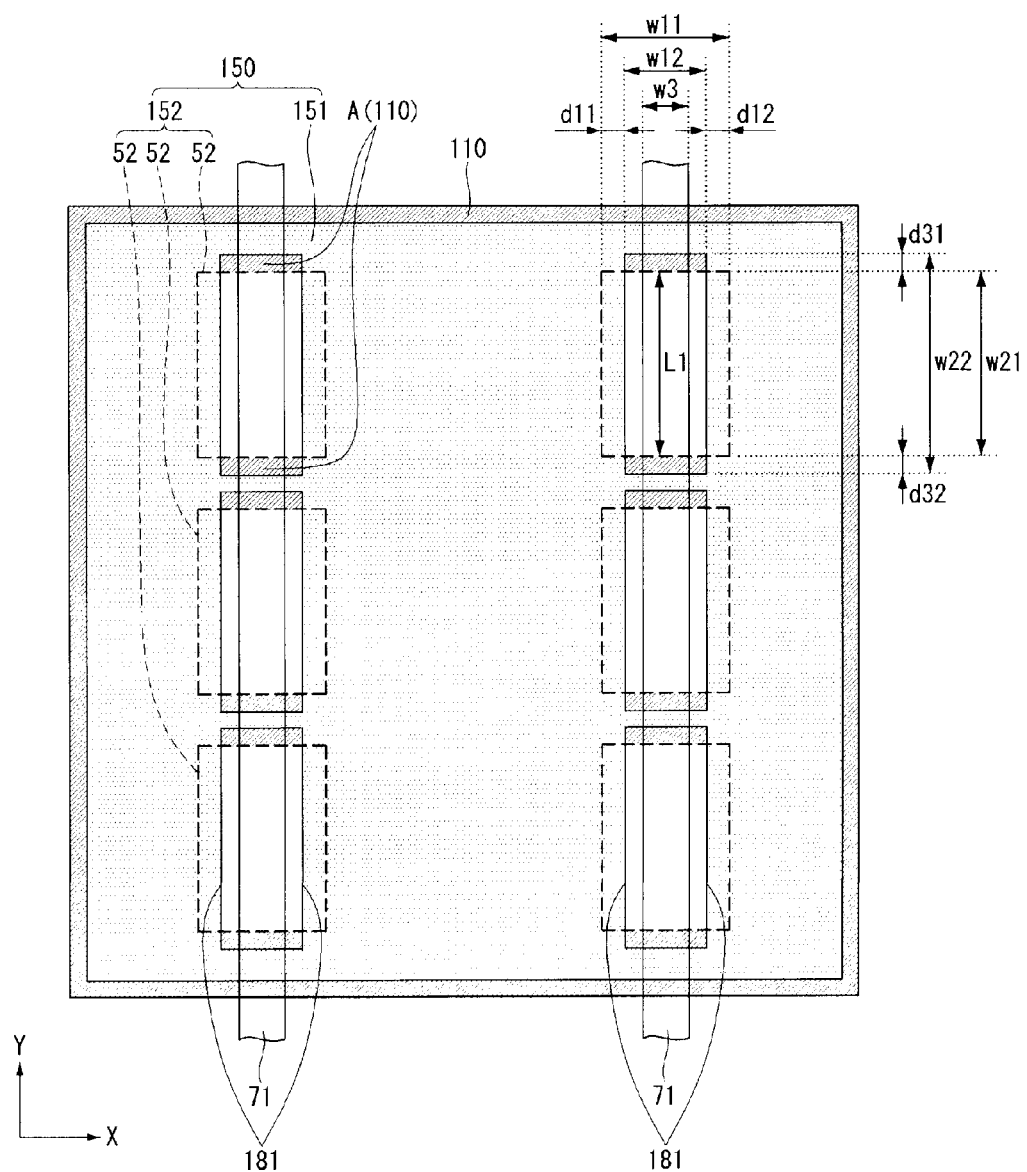

In the configuration illustrated in FIG. 10, the conductor 52 overlaps the back electrode 151 in the X-axis direction, but does not overlap the back electrode 151 in the Y-axis direction. Further, the conductor 52 does not abut the back electrode 151.

For example, the left edge portion of the conductor 52 overlaps the back electrode 151 by the first overlap distance d11, and the right edge portion of the conductor 52 overlaps the back electrode 151 by the second overlap distance d12. The first and second overlap distances d11 and d12 may be substantially equal to or different from each other.

On the other hand, in the configuration illustrated in FIG. 10, the conductor 52 does not overlap and does not abut the back electrode 151 in the Y-axis direction.

Hence, the conductor 52 has the exposing portions A exposing the back surface of the substrate 110 between the upper end of the conductor 52 and the end of the back electrode 151 adjacent to the upper end and between the lower end of the conductor 52 and the end of the back electrode 151 adjacent to the lower end.

According to the configuration illustrated in FIG. 10, the protrusion preventing the extension of the conductive film 71 is not generated in the upper and lower edge portions of the conductor 52 in the extension area of the conductive film 71.

Accordingly, when the conductor 52 has the exposing portion A exposing a portion of the substrate 110 between the conductor 52 and the back electrode 151 as shown in FIGS. 8 to 10, each of the openings 181 of the back electrode 151 exposes a portion of the conductor 52, a portion of the end of the conductor 52, and a portion of the back surface of the substrate 110.

As described above, distances d31 and d32 of the exposing portions A between the upper and lower ends of the conductor 52 and the ends of the back electrode 151 adjacent to the upper and lower ends may be equal to or less than about 0.25 µm. When distances d31 and d32 are equal to or less than about 0.25 µm, the formation area of the BSF region 172 is stably secured. Hence, the BSF region 172 may further prevent the recombination and/or the disappearance of electrons and holes.

As shown in FIGS. 6, 7, and 9, when the conductor 52 does not overlap the back electrode 151 in the Y-axis direction and at least one of the upper and lower ends of the conductor 52 abuts the end of the back electrode 151 adjacent to at least one end, each opening 181 of the back electrode 151 exposes a portion of the conductor 52 and at least one of the upper and lower ends of the conductor 52.

As described above, as shown in FIGS. 4 to 10, the plurality of conductors 52 overlap the back electrode 151 and are electrically and physically connected to the back electrode 151, and the conductive film 71 is attached on the virtual line S1, i.e., on the plurality of conductors 52 positioned along the extension direction of the back electrode current collector 152.

In this instance, because the plurality of conductors 52 are spaced apart from one another at a fixed distance therebetween, the conductive film 71 is positioned on the plurality of conductors 52 exposed through the openings 181 and on the back electrode 151 positioned between the two adjacent conductors 52.

A width w3 of the conductive film 71 may be less than the width w11 of each conductor 52 in a transverse direction (i.e., the X-axis direction) and may be less than the width w12 of each opening 181 of the back electrode 151 in the X-axis direction. For example, the width w3 of the conductive film 71 may be about 1.5 mm to 2 mm. Hence, the conductive film 71 is stably positioned on the same line and on the conductors 52 exposed through the openings 181.

As shown in FIGS. 4 to 10, one of the first overlap distance d11 between the left edge portion of the conductor 52 and the back electrode 151 and the second overlap distance d12 between the right edge portion of the conductor 52 and the back electrode 151 is greater than one of the third overlap distance d21 between the upper edge portion of the conductor 52 and the back electrode 151 and the fourth overlap distance d22 between the lower edge portion of the conductor 52 and the back electrode 151. Further, the average distance of the first and second overlap distances d11 and d12 is greater than the average distance of the third and fourth overlap distances d21 and d22.

Accordingly, a difference wd1 (=w11−w12) between the width w11 of the conductor 52 and the width w12 of the opening 181 in the X-axis direction is greater than a difference wd2 (=w21−w22) between the width w21 of the conductor 52 and the width w22 of the opening 181 in the Y-axis direction. For example, as shown in FIG. 6, the difference wd1 in the X-axis direction has a positive value, and the difference wd2 in the Y-axis direction is substantially zero. Further, as shown in FIGS. 9 and 10, the difference wd1 in the X-axis direction has a positive value, and the difference wd2 in the Y-axis direction has a negative value. In this instance, the difference wd1 (=w11−w12) between the width w11 of the conductor 52 and the width w12 of the opening 181 in the X-axis direction is greater than the difference wd2 (=w21−w22) between the width w21 of the conductor 52 and the width w22 of the opening 181 in the Y-axis direction.

Accordingly, in the various configurations illustrated in FIGS. 4 to 10, an average overlap area of the upper and lower edge portions of the conductor 52 positioned in the X-axis direction crossing the same direction (i.e., the Y-axis direction corresponding to the extension direction of the back electrode current collector 152 or the extension direction of the conductive film 71) as the virtual line S1 is less than an average overlap area of the left and right edge portions of the conductor 52 positioned in the Y-axis direction.

As a result, the overlap area of the conductor 52 and the back electrode 151 positioned in the extension area of the conductive film 71, and thereby preventing the extension of the conductive film 71, is reduced or omitted, and a stepped area between the back electrode 151 and the back electrode current collector 152 is reduced or omitted. Hence, an adhesive strength between the conductor 52 and the conductive film 71 increases. Further, because a length L1 of the conductor 52 (i.e., a width of the conductor 52 in the Y-axis direction), which is exposed through the opening 181 of the back electrode 151 and extends in the extension direction of the conductive film 71, increases, a contact area between the conductor 52 and the conductive film 71 increases. Hence, an amount of carriers output to the external device through the conductive film 71 attached to the back electrode current collector 152 increases, and the efficiency of the solar cell 11 is improved.

In the embodiment of the invention, each of the overlap distances d11, d12, d21, and d22 between the conductor 52 and the back electrode 151 may be about 0.25 mm to 0.5 mm. A width of the conductor 52 which does not overlap the back electrode 151 and is exposed through the opening 181, is substantially equal to the width w21 of the opening 181. In the embodiment of the invention, the width w21 of the opening 181 may be about 2.5 mm.

When each of the overlap distances d11, d12, d21, and d22 is equal to or greater than about 0.25 mm, a contact area between the back electrode 151 and the back electrode current collector 152 is stably secured. Hence, the movement of carriers from the back electrode 151 to the back electrode current collector 152 is smoothly carried out. When each of the overlap distances d11, d12, d21, and d22 is equal to or less than about 0.5 mm, the movement of carriers from the back electrode 151 to the back electrode current collector 152 is stably carried out, and the unnecessary material consumption of the back electrode 151 and the back electrode current collector 152 is reduced.

FIGS. 3 to 10 show the conductor 52 having a rectangular shape. However, the conductor 52 may have various shapes such as a square, a circle, an oval, or a triangle. The various configurations illustrated in FIGS. 4 to 10 may be applied to the conductor 52 having shapes other than the rectangular shape.

Figure 11:
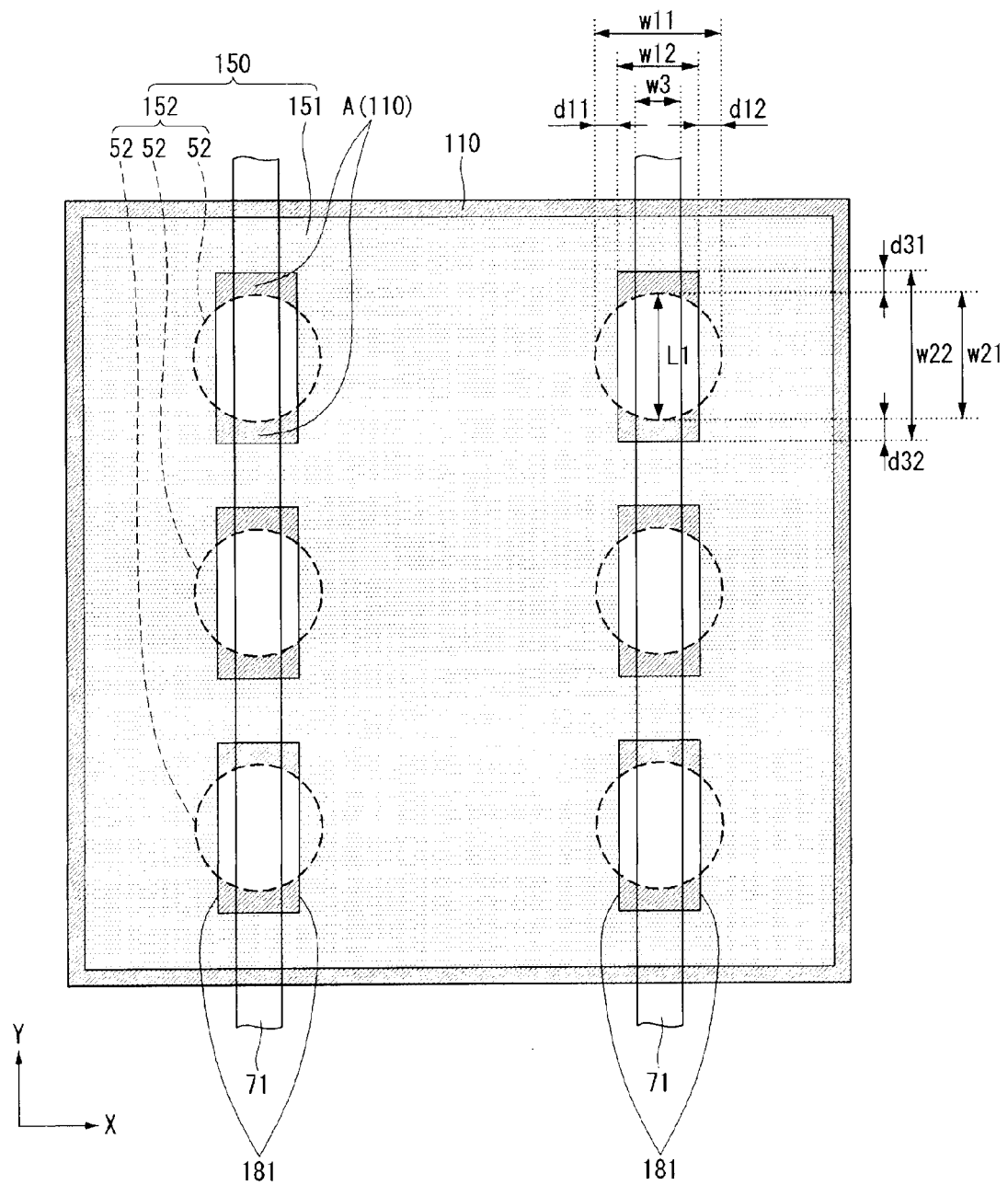

FIG. 11 shows the conductor 52 having a circle shape.

As shown in FIG. 11, an upper surface of each circular conductor 52 overlaps the back electrode 151 in the X-axis direction and does not overlap the back electrode 151 in the Y-axis direction, similar to FIG. 10.

Accordingly, an overlap portion between the conductor 52 and the back electrode 151 is generated only in the edge portion (i.e., the left and right edge portions of the conductor 52) positioned in the extension direction of the conductive film 71 (i.e., the Y-axis direction corresponding to the extension direction of the back electrode current collector 152 or the extension direction of the virtual line S1). Further, a portion (for example, the upper and lower edge portions of the conductor 52) of the conductor 52 positioned in the X-axis direction crossing the Y-axis direction does not overlap the back electrode 151. Hence, the left and right edge portions of the conductor 52 overlapping the back electrode 151 are positioned on the opposite sides of the opening 181 in the same manner as FIG. 10.

The conductor 52 has exposing portions A exposing the back surface of the substrate 110 between the upper end of the conductor 52 and the end of the back electrode 151 adjacent to the upper end and between the lower end of the conductor 52 and the end of the back electrode 151 adjacent to the lower end. Thus, the back electrode 151 includes the plurality of openings 181, each opening 181 of the back electrode 151 exposes a portion of the conductor 52 and a portion of the end of the conductor 52.

Minimum distances d31 and d32 between the upper and lower ends of the conductor 52 and the ends of the back electrode 151 adjacent to the upper and lower ends may be equal to or less than about 0.25 μm.

An overlap distance (a maximum overlap distance) d11 between the left edge portion of the conductor 52 and the back electrode 151 and an overlap distance (a maximum overlap distance) d12 between the right edge portion of the conductor 52 and the back electrode 151 may be about 0.25 mm to 0.5 mm. A width w12 of the conductor 52 exposed through the opening 181 may be about 2.5 mm.

FIG. 11 illustrates the configuration in which the circular conductor 52 has the exposing portions A which do not overlap the back electrode 151 in the upper and lower edge portions of the conductor 52 and expose the back surface of the substrate 110 similar to FIG. 10. However, as described above, the configurations illustrated in FIGS. 4 to 9 may be applied to the configuration of FIG. 11 having the circular conductors 52.

In the embodiment of the invention, a length L1 of the conductor 52, which is exposed through the opening 181 and extends in the extension direction of the conductive film 71, may be about 6 mm to 10 mm.

When the length L1 of the conductor 52 is equal to or greater than about 6 mm, a contact area between the conductor 52 and the conductive film 71 is stably secured. Hence, the movement of carriers from the back electrode current collector 152 to the external device is stably carried out through the conductive film 71.

When the length L1 of the conductor 52 is equal to or less than about 10 mm, a formation area of the back electrode current collector 152 decreases and a formation area of the back electrode 151 increases. Hence, the formation area of the BSF region 172 stably increases. As a result, the efficiency of the solar cell 11 is improved, and the manufacturing cost of the solar cell 11 is efficiently reduced.

The edge portions (i.e., both right and left sides in FIG. 11) of each conductor 52 not affecting the adhesive strength between the conductive film 71 and the conductors 52 are positioned under the back electrode 151, and the upper surface of each conductor 52 partially overlaps the back electrode 151. Thus, a peeling phenomenon of the conductors 52 from the back surface of the substrate 110 is prevented, and a defect rate of the solar cell 11 is reduced.

Because the overlap area between the edge portion of the conductor 52 and the back electrode 151 decreases or the conductor 52 does not overlap the back electrode 151 in some of the left, right, upper, and lower edge portions of the conductor 52, a damage rate generated in the overlap area between the back electrode 151 and the conductor 52 resulting from the load applied from the outside is greatly reduced.

In other words, when the plurality of solar cells 11 overlap one another in a height direction and then move, or when the plurality of solar cells 11 are connected in series or in parallel to one another and then a compression process for forming a solar cell module is performed, the load is applied more greatly to the overlap areas between the back electrode 151 and the conductors 52 than the non-overlap areas between the back electrode 151 and the conductors 52. Therefore, a damage, for example, a crack is generated in the overlap areas. However, in the embodiment of the invention, the damage rate resulting from the load is reduced because of a reduction in the overlap area between the back electrode 151 and the back electrode current collector 152. As a result, the manufacturing efficiency of the solar cell 11 and the solar cell module is improved.

Figure 12:
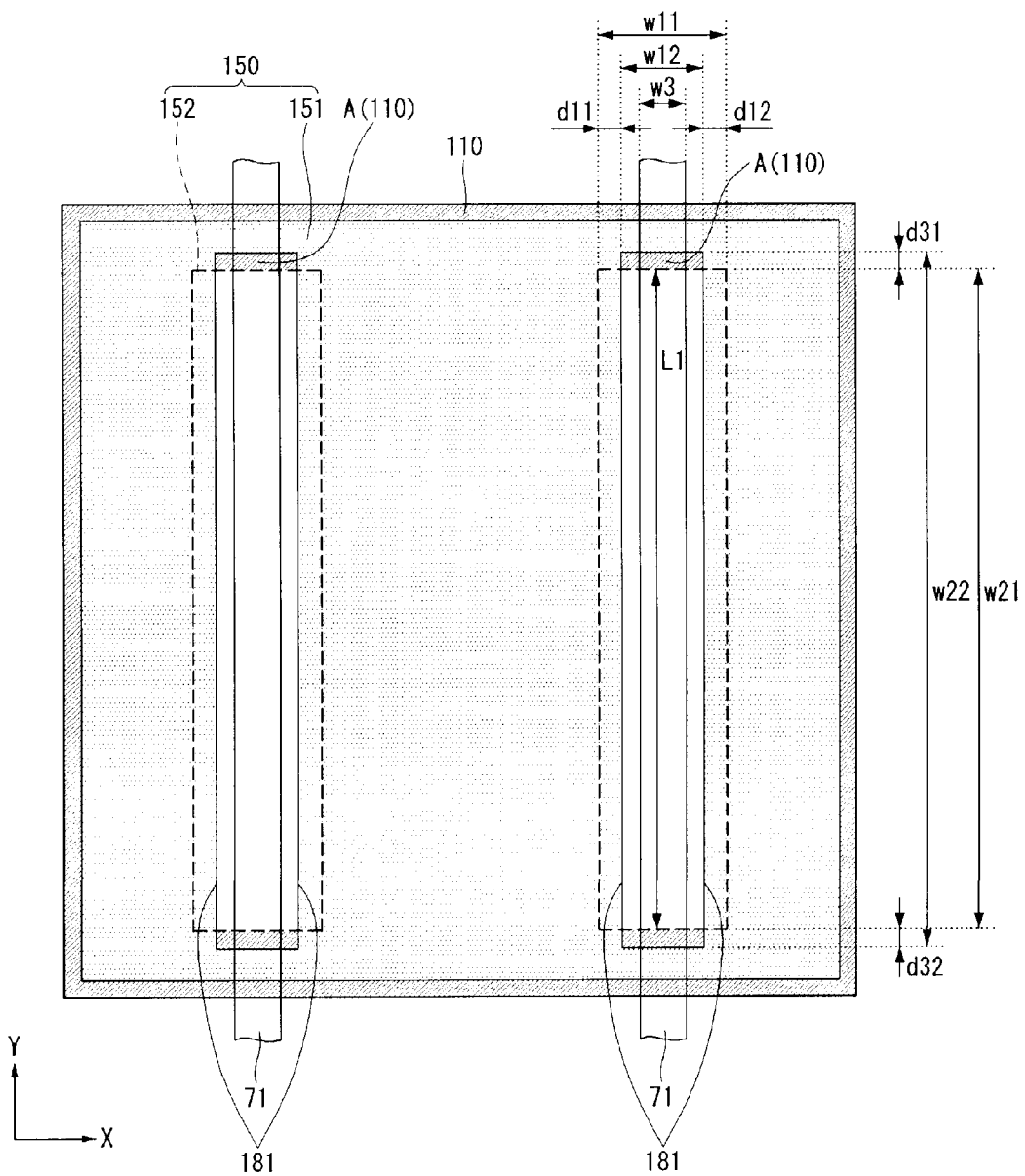

FIG. 12 illustrates another configuration of the back electrode current collector 152 according to the embodiment of the invention.

In the configuration illustrated in FIGS. 1 to 11, the back electrode current collector 152 includes the plurality of conductors 52 which are separated from one another along the virtual line S1. On the other hand, in the configuration illustrated in FIG. 12, the back electrode current collector 152 includes one conductor having a stripe shape elongating in a corresponding direction in the same manner as the front electrode current collector 142. Because the back electrode 151 has the opening 181 exposing a portion of the back electrode current collector 152, the number of the back electrode current collector 152 is the same as the number of the opening 181.

As shown in FIG. 12, an edge of the back electrode current collector 152 has an edge portion overlapping the back electrode 151 adjacent to the edge of the back electrode 151 and an edge portion not overlapping the back electrode 151 adjacent to the edge of the back electrode 151. Namely, similar to FIG. 10, a portion (for example, a portion of each of left and right edge portions) of the back electrode current collector 152 positioned parallel to the extension direction of the conductive film 71 (i.e., the extension direction of the virtual line S1) overlaps the back electrode 151. A portion (for example, upper and lower edge portions) of the back electrode current collector 152 positioned in the direction crossing the extension direction of the conductive film 71 does not overlap the back electrode 151.

As shown in FIG. 12, distances d31 and d32 between ends (i.e., upper and lower ends) of the upper and lower edge portions of the back electrode current collector 152 and ends of the back electrode 151 adjacent to the upper and lower ends may be equal to or less than about 0.25 µm. The back electrode current collector 152 has exposing portions A exposing the back surface of the substrate 110 between the upper end of the back electrode current collector 152 and the end of the back electrode 151 adjacent to the upper end and between the lower end of the back electrode current collector 152 and the end of the back electrode 151 adjacent to the lower end.

Overlap distances d11 and d12 between the left and right edge portions of the back electrode current collector 152 and the back electrode 151 may be about 0.25 mm to 0.5 mm. A width w21 of the back electrode current collector 152 exposed through the opening 181 may be about 2.5 mm. In the configuration illustrated in FIG. 12 including the stripe-shaped back electrode current collector 152, one of the first overlap distance d11 between the left edge portion of the back electrode current collector 152 and the back electrode 151 and the second overlap distance d12 between the right edge portion of the back electrode current collector 152 and the back electrode 151 is greater than one of a third overlap distance (d21 is substantially zero in FIG. 12 between the upper edge portion of the back electrode current collector 152 and the back electrode 151 and a fourth overlap distance (d22 is substantially zero in FIG. 12) between the lower edge portion of the back electrode current collector 152 and the back electrode 151. Further, an average distance of the first and second overlap distances d11 and d12 is greater than an average distance of the third and fourth overlap distances.

Hence, an average overlap area of the upper and lower edge portions of the back electrode current collector 152 positioned in the direction (for example, the X-axis direction) crossing the extension direction (for example, the Y-axis direction) of the conductive film 71 corresponding to the extension direction of the virtual line S1 is less than an average overlap area of the left and right edge portions of the back electrode current collector 152 positioned in the extension direction of the conductive film 71.

Accordingly, a stepped area between the back electrode 151 and the back electrode current collector 152 in the formation area of the conductive film 71 is reduced or removed. As a result, an adhesive strength between the conductive film 71 and the back electrode current collector 152 is improved.

When compared to the configuration illustrated in FIGS. 1 to 11, a contact area between the back electrode current collector 152 and the conductive film 71 increases because of an increase in the formation area of the stripe-shaped back electrode current collector 152. Hence, an amount of carriers output from the back electrode current collector 152 to the conductive film 71 further increased.

In addition, because the formation area of the stripe-shaped back electrode current collector 152 positioned on the back surface of the substrate 110 increases, an amount of carriers transferred to the stripe-shaped back electrode current collector 152 through the back electrode 151 and the back surface of the substrate 110 increases. Hence, an amount of carriers transferred from the substrate 110 to the back electrode current collector 152 further increases, and the efficiency of the solar cell 11 is improved.

The various configurations illustrated in FIGS. 4 to 9 may be applied to the configuration illustrated in FIG. 12 including the stripe-shaped back electrode current collector 152.

An operation of the solar cell 11 having the above-described structure is described below.

When light irradiated to the solar cell 11 is incident on the semiconductor part, i.e., the substrate 110 and the emitter region 121 through the anti-reflection layer 130, electrons and holes are generated in the substrate 110 and the emitter region 121 by light energy produced based on the incident light. In this instance, because a reflection loss of the light incident on the substrate 110 is reduced by the anti-reflection layer 130, an amount of light incident on the substrate 110 increases.

The electrons and the holes respectively move to the n-type semiconductor part, for example, the emitter region 121 and the p-type semiconductor part, for example, the substrate 110 by the p-n junction of the substrate 110 and the emitter region 121. The electrons moving to the emitter region 121 are collected by the front electrodes 141 and the front electrode current collector 142 and then move along the front electrode current collector 142. The holes moving to the substrate 110 are collected by the back electrode 151 and the back electrode current collector 152 and then move along the back electrode current collector 152. When the front electrode current collector 142 is connected to the back electrode current collector 152 using the conductive film 71, current flows therein to thereby enable use of the current for electric power.

Further, when the back electrode current collector 152 includes the plurality of conductors 52, which have the island shape and are separated from one another, the formation area of the back electrode 151 and the formation area of the BSF region 172 increase. Hence, the efficiency of the solar cell 11 is improved, and the manufacturing cost of the solar cell 11 is reduced.

In addition, an overlap distance (or an overlap area) between the edge portion of each conductor 52 positioned in the extension direction of the conductive film 71 and the back electrode 151 adjacent to the edge portion decreases. Hence, a stepped portion between each conductor 52 and the adjacent back electrode 151 is reduced, and an adhesive strength between the conductive film 71 and each conductor 52 is improved.

Various examples of a solar cell according to another example embodiment of the invention are described below with reference to FIGS. 13 to 17.

Configuration of the solar cell shown in FIGS. 13 to 17 is substantially the same as the solar cell 11 shown in FIGS. 1 to 12 except for a shape of the back electrode current collector 152. Thus, structures and components identical or equivalent to those illustrated in FIGS. 13 to 17 are designated with the same reference numerals as FIGS. 1 to 12, and a further description may be briefly made or may be entirely omitted.

Figure 13:
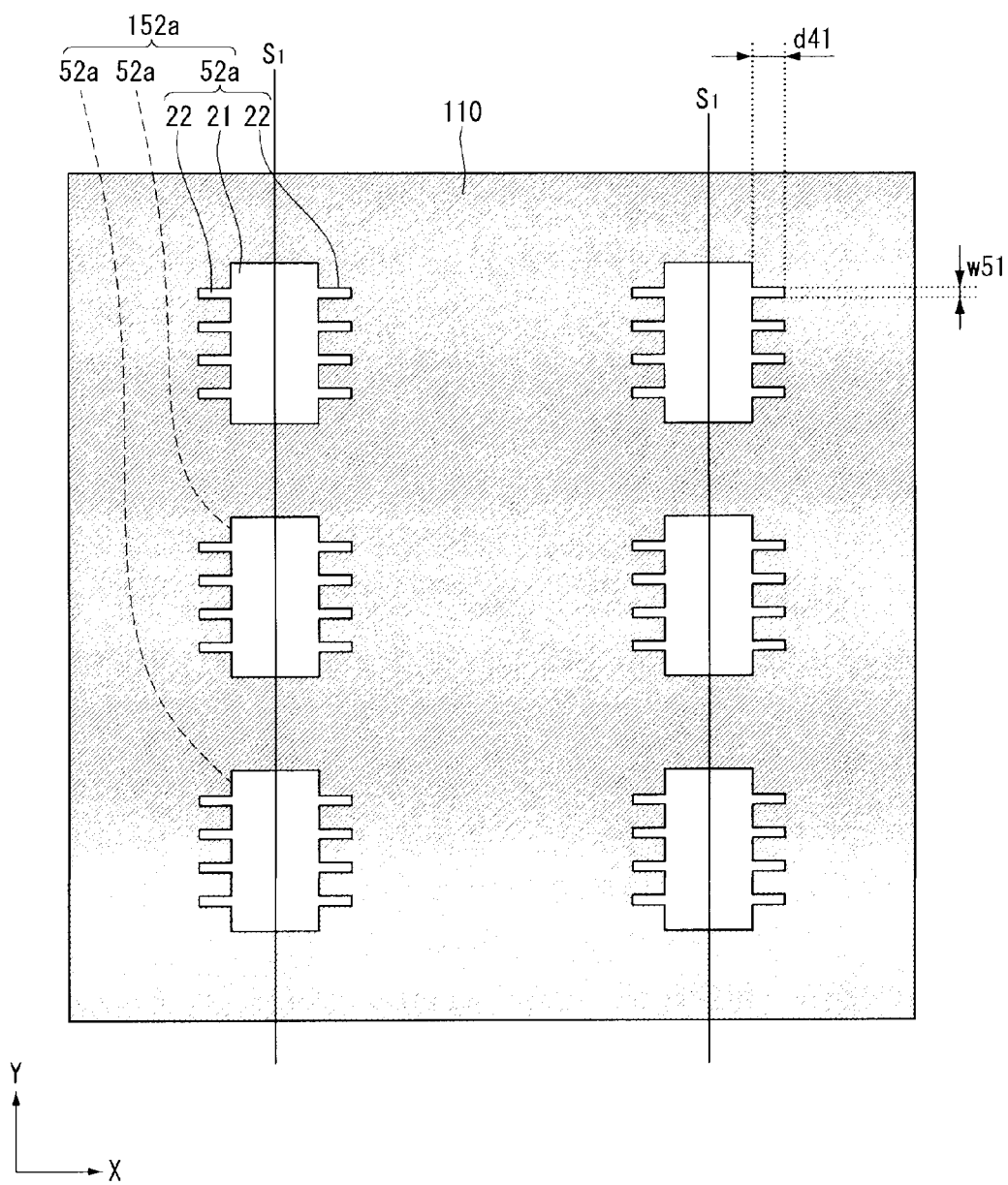
FIGS. 13 and 15 are schematic plane views of a conductor of a back electrode current collector in a solar cell according to another exemplary embodiment of the invention.
Figure 14:
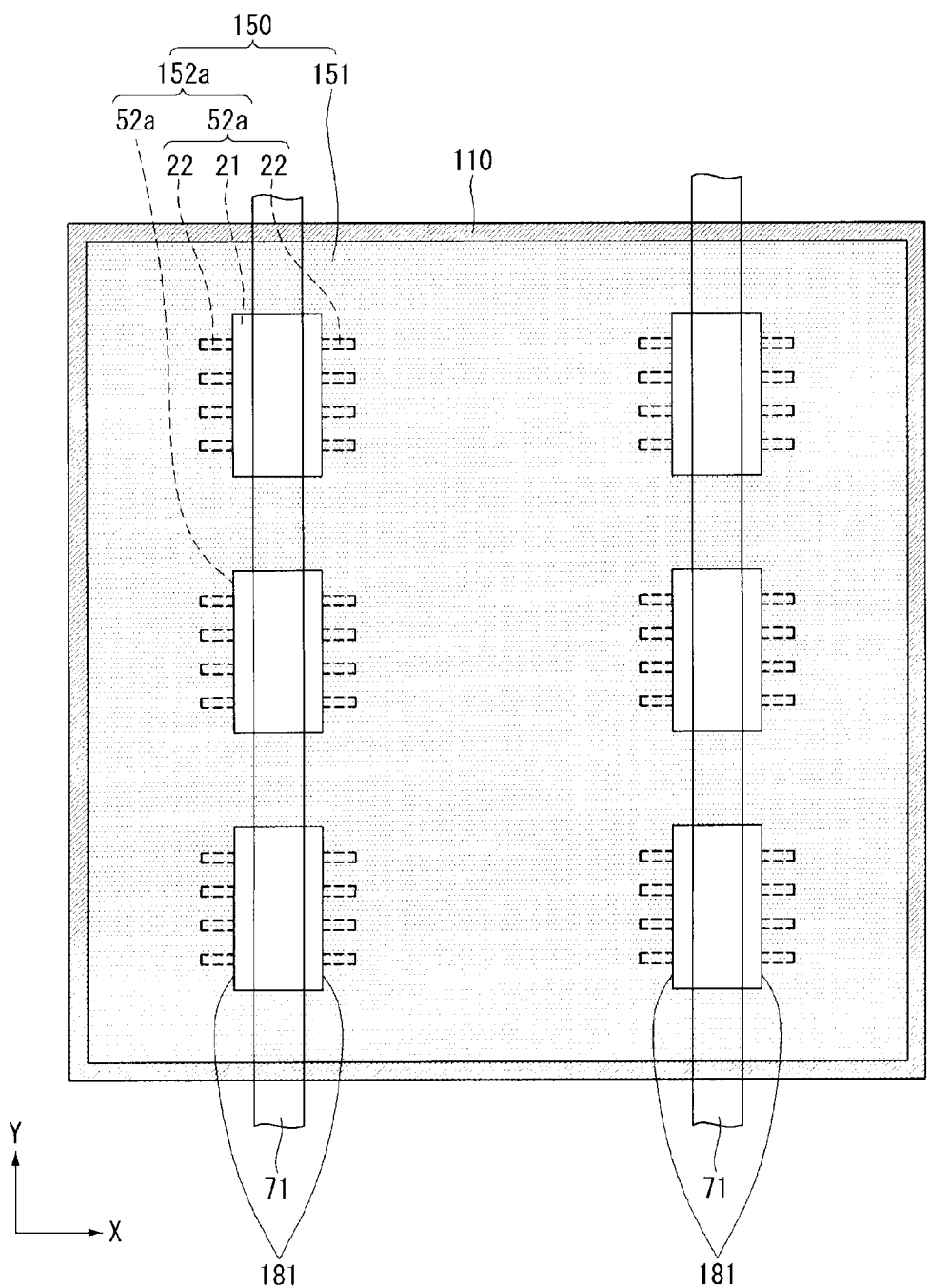
FIGS. 14 and 16 illustrate overlap examples between a back electrode and conductors shown in FIGS. 13 and 15, respectively.
Figure 15:
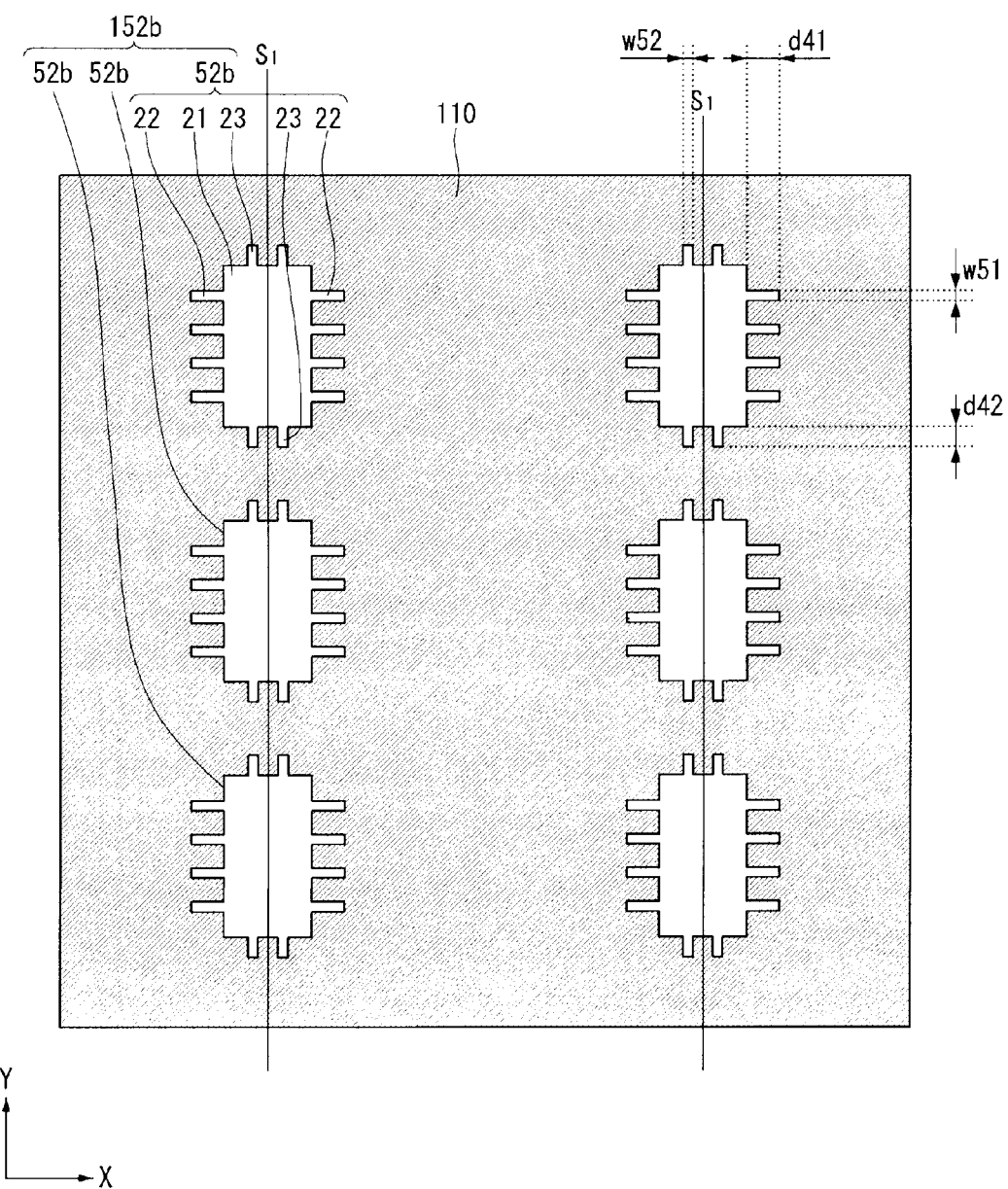
Figure 16:
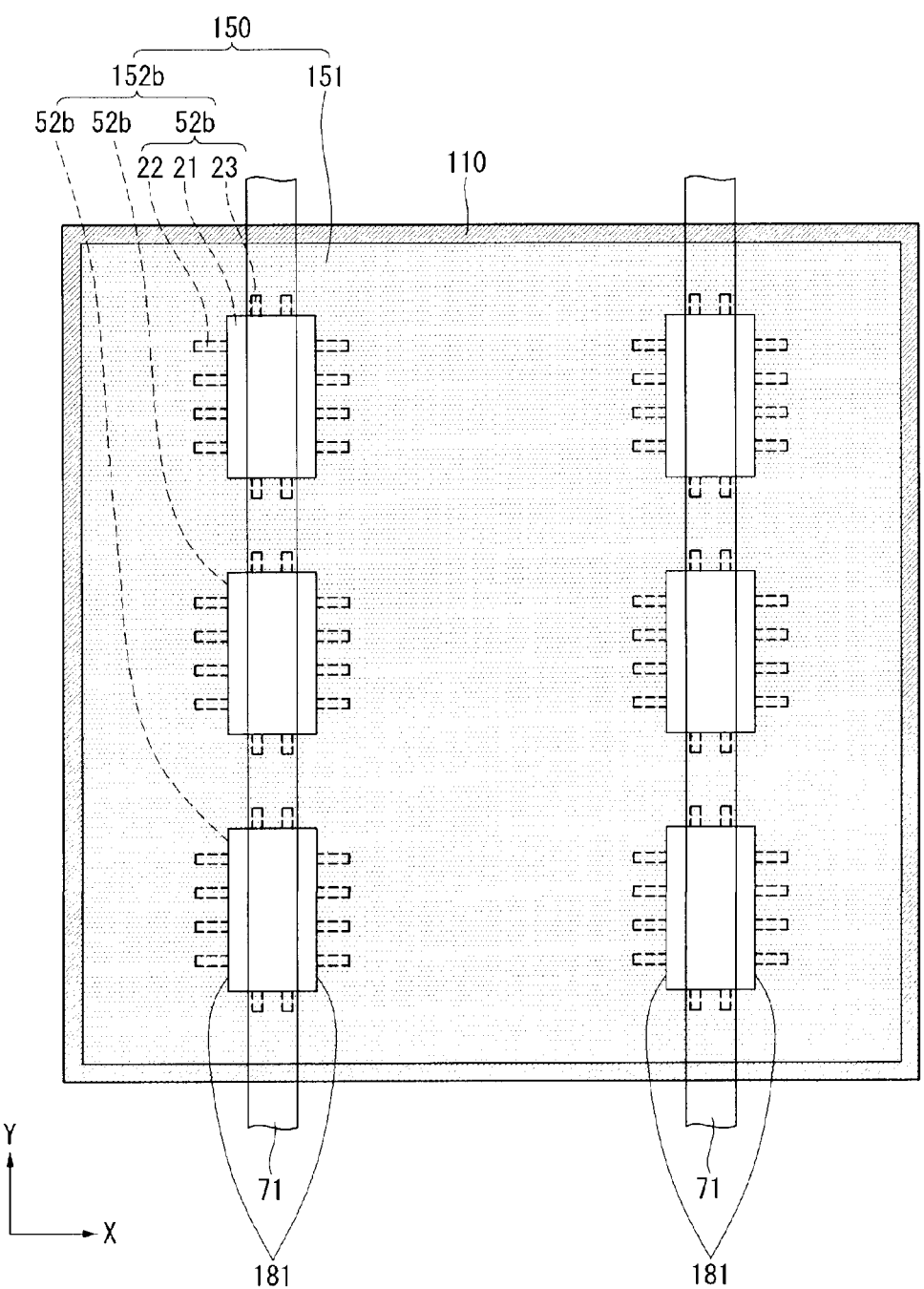

A back electrode current collector 152a of FIGS. 13 and 14 positioned on a substrate 110 includes a plurality of conductors 52a, and a back electrode current collector 152b of FIGS. 15 and 16 positioned on the substrate 110 includes a plurality of conductors 52b.

As shown in FIGS. 13 and 14, each of the plurality of conductors 52a includes a body 21 having various shapes such as a rectangle and a plurality of branches 22 protruding from the body 21 at a fixed distance therebetween. Further, as shown in FIGS. 15 and 16, each of the plurality of conductors 52b includes a body 21 having various shapes such as a rectangle and a plurality of branches 22 and 23 protruding from the body 21 at a fixed distance therebetween.

The plurality of branches 22 shown in FIGS. 13 and 14 include a plurality of first branches 22 protruding from left and right edges of the body 21 in the X-axis direction. The plurality of branches 22 and 23 shown in FIGS. 15 and 16 include a plurality of first branches 22 protruding from left and right edges of the body 21 in the X-axis direction and a plurality of second branches 23 protruding from upper and lower edges of the body 21 in the Y-axis direction.

A width w51 of the first branch 22 may be equal to or greater than a width w52 of the second branch 23, and a length d42 of the second branch 23 may be shorter than a length d41 of the first branch 22.

As shown in FIGS. 14 and 16, because a back electrode 151 includes a plurality of openings 181 exposing the body 21 of the conductor 52a (52b), the back electrode 151 overlaps at least one of the first and second branches 22 and 23.

In other words, as shown in FIG. 13, since each conductor 52a includes the body 21 having the plurality of first branches 22 only on the left and right edge portions of the body 21, as shown in FIG. 14, each conductor 52a has an overlap portion between the first branches 22 and the back electrode 151. However, upper and lower edge portions of the conductor 52a shown in FIG. 14 do not overlap the back electrode 151, and ends (i.e., upper and lower ends) of the upper and lower edge portions of the conductor 52a abut the back electrode 151.

On the other hand, as shown in FIG. 15, since each conductor 52b including the body 21 having the plurality of second branches 23 on the upper and lower edge portions of the bode 21 as well as the plurality of first branches 22 on the left and right edge portions of the body 21, as shown in FIG. 16, each conductor 52b has an overlap portion between the first branches 22 and the back electrode 151 and an overlap portion between the second branches 23 and the back electrode 151. Thereby, in FIG. 16, an overlap distance between each first branch 22 and the back electrode 151 is greater than an overlap distance between each second branch 23 and the back electrode 151, and thus an average overlap distance between the first branches 22 and the back electrode 151 is greater than an average overlap distance between the second branches 23 and the back electrode 151.

Thus, in FIGS. 14 and 16, an average overlap area between the conductor 52a (52b) and the back electrode 151 in an extension direction (i.e., the Y-axis direction) of a conductive film 71 is less than an average overlap area between the conductor 52a (52b) and the back electrode 151 in a direction (i.e., the X-axis direction) crossing the extension direction of the conductive film 71.

Hence, a stepped area between the conductor 52a (52b) and the back electrode 151 formed in an extension area of the conductive film 71 is reduced or removed. As a result, an adhesive strength between the conductive film 71 and the conductor 52a (52b) is improved.

The formation area of the conductor 52a (52b) decreases, and thus an amount of material containing silver (Ag) used for the conductor 52a (52b) decreases. Hence, the manufacturing cost of the back electrode current collector 152a (152b) is reduced, and the manufacturing cost of the solar cell is reduced.

In the configuration illustrated in FIGS. 13 and 15, the first branches 22 protrude from the left and right edges of the body 21 of the conductor 52a (52b). However, the first branches 22 may protrude from only one of the left and right edges of the body 21 of the conductor 52a (52b). In the configuration illustrated in FIG. 15, the second branches 23 protrude from the upper and lower edges of the body 21 of the conductor 52b. However, the second branches 23 may protrude from only one of the upper and lower edges of the body 21 of the conductor 52b. In this instance, an overlap distance between the first branch 22 positioned in at least one of the left and right edges of the body 21 and the back electrode 151 is greater than an overlap distance between the second branch 23 positioned in at least one of the upper and lower edges of the body 21 and the back electrode 151. Thus, an average overlap distance between the first branch 22 and the back electrode 151 is greater than an average overlap distance between the second branch 23 and the back electrode 151.

Further, in the configuration illustrated in FIGS. 14 and 16, each opening 181 of the back electrode 151 has the same shape as the body 21 of the conductor 52a (52b). Namely, the opening 181 has the same shape and size as the body 21. Alternatively, when the conductor 52a (52b) and the back electrode 151 are out of alignment in at least one of the X-axis and Y-axis directions, the overlap distances between the conductor 52a (52b) and the back electrode 151 may change. Namely, similar to FIGS. 5 to 10, an average overlap area (i.e., an average overlap distance) between the first branch 22 positioned at the left edge of the conductor 52a (52b) and the back electrode 151 may be different from an average overlap area (i.e., an average overlap distance) between the first branch 22 positioned at the right edge of the conductor 52a (52b) and the back electrode 151. Further, an average overlap area (i.e., an average overlap distance) between the second branch 23 positioned at the upper edge of the conductor 52b and the back electrode 151 may be different from an average overlap area (i.e., an average overlap distance) between the second branch 23 positioned at the lower edge of the conductor 52b and the back electrode 151. However, even in this instance, the average overlap distance between the first branch 22 and the back electrode 151 is greater than the average overlap distance between the second branch 23 and the back electrode 151. Thus, an average overlap area between the conductor 52a (52b) and the back electrode 151 in the Y-axis direction is less than an average overlap area between the conductor 52a (52b) and the back electrode 151 in the X-axis direction. As a result, the stepped area between the conductor 52a (52b) and the back electrode 151 in the formation area of the conductive film 71 is reduced or is removed, and the adhesive strength between the conductive film 71 and the conductor 52a (52b) is improved.

The above-described structure of the back electrode current collector 152a (152b), in which the conductor 52a (52b) includes at least one of the first and second branches 22 and 23 protruding from the body 21, may be applied to the back electrode current collector 152 illustrated in FIG. 12.

Figure 17:
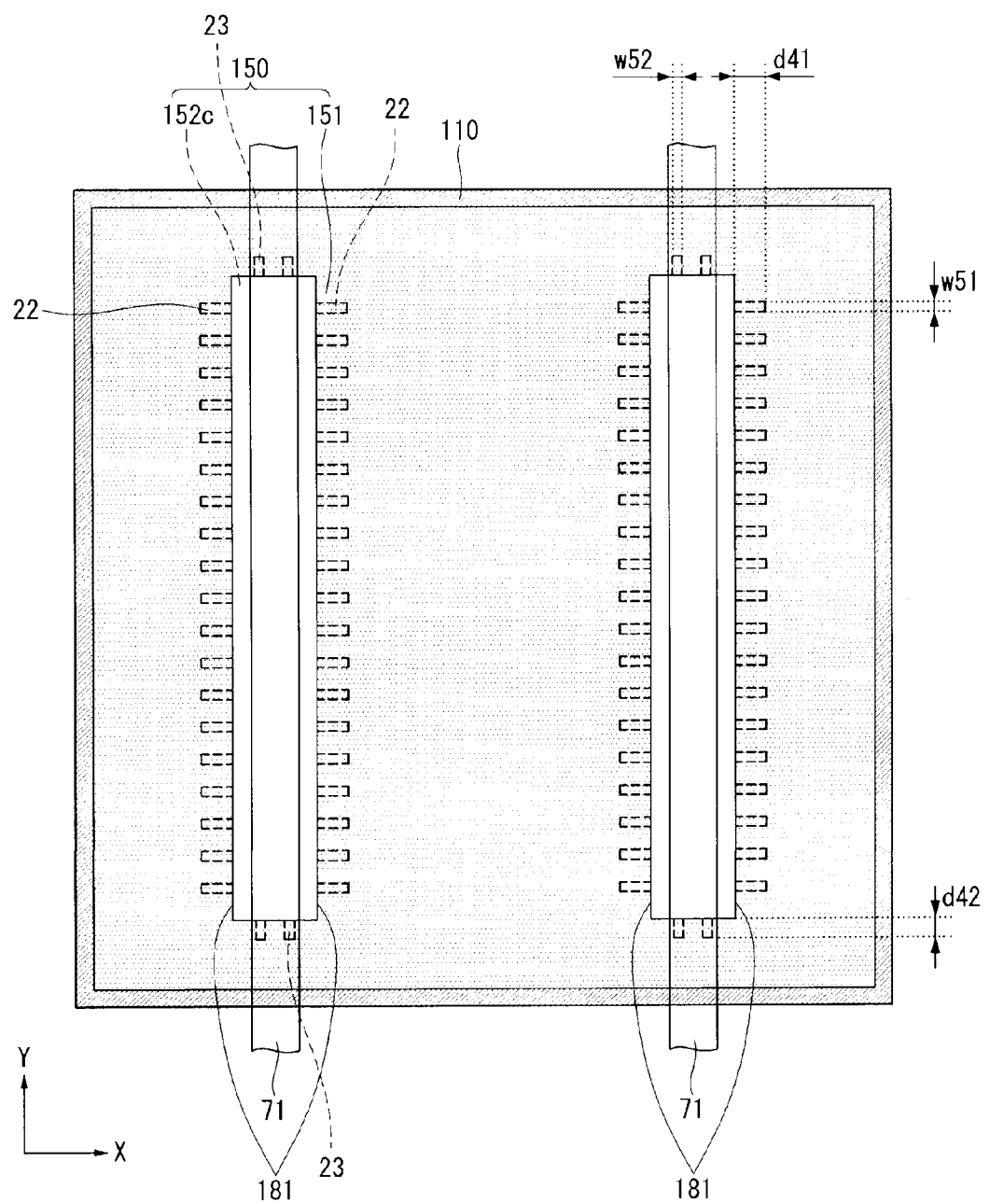
FIG. 17 illustrates an overlap example between a back electrode and a back electrode current collector in a solar cell according to another exemplary embodiment of the invention.

More specifically, as shown in FIG. 17, a back electrode current collector 152c having a stripe shape elongating in one direction may include a plurality of first branches 22 protruding from a body 21 in the X-axis direction and a plurality of second branches 23 protruding from the body 21 in the Y-axis direction. Alternatively, the second branches 23 may be omitted. In this instance, configuration of the back electrode current collector 152c is substantially the same as the back electrode current collector 152 illustrated in FIG. 12, except that the back electrode current collector 152c includes the first and second branches 22 and 23.

As described above, a width w51 of the first branch 22 may be equal to or greater than a width w52 of the second branch 23, and a length d42 of the second branch 23 may be shorter than a length d41 of the first branch 22.

Accordingly, an average overlap distance between each first branch 22 and the back electrode 151 is greater than an average overlap distance between each second branch 23 and the back electrode 151. Hence, an average overlap area between the back electrode current collector 152c and the back electrode 151 in an extension direction (i.e., the Y-axis direction) of a conductive film 71 is less than an average overlap area between the back electrode current collector 152c and the back electrode 151 in a direction (i.e., the X-axis direction) crossing the extension direction of the conductive film 71.

According to the configurations illustrated in FIGS. 14, 16, and 17, the overlap area between the upper edge portion of each of the back electrode current collectors 152a to 152c and the back electrode 151 and the overlap area between the lower edge portion of each of the back electrode current collectors 152a to 152c and the back electrode 151 in the formation area of the conductive film 71 is decreased.

According to the configuration illustrated in FIG. 17, a stepped area between the back electrode current collector 152c and the back electrode 151 in the formation area of the conductive film 71 is reduced or removed. Hence, an adhesive strength between the conductive film 71 and the back electrode current collector 152c is improved. As a result, the manufacturing cost of the back electrode current collector 152c is reduced.

In the configurations illustrated in FIGS. 1 to 17, the back electrode current collector 152 (152a to 152c) is entirely positioned directly on the back surface of the substrate 110, and a portion of the back electrode 151 is positioned on a portion of the back electrode current collector 152 (152a to 152c). Hence, the conductor 52 (52a and 52b) or the back electrode current collector 152c in the overlap area between the back electrode current collector 152 (152a to 152c) and the back electrode 151 is positioned directly on the back surface of the substrate 110. Further, the back electrode 151 is positioned on a portion of the upper surface of the conductor 52 (52a and 52b) or the back electrode current collector 152c and includes the plurality of openings 181 exposing a portion of the conductor 52 (52a and 52b) or the back electrode current collector 152c. Thus, the back electrode current collector 152 (152a to 152c) overlaps the back electrode 151.

Figure 20:
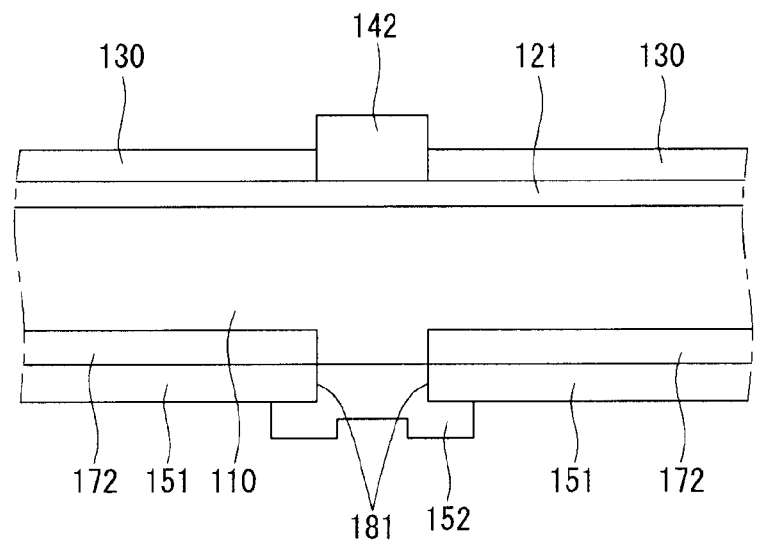
FIG. 20 is a partial cross-sectional view of a solar cell according to another exemplary embodiment of the invention.

Alternatively, as shown in FIG. 20, the back electrode 151 is entirely positioned directly on the back surface of the substrate 110, and thus a portion of the back electrode current collector 152 (152a to 152c) may be positioned on a portion of the back electrode 151. In this instance, the back electrode current collector 152 (152a to 152c) positioned inside the openings 181 is positioned directly on the back surface of the substrate 110. Hence, the back electrode 151 including the plurality of openings 181 exposing a portion of the substrate 110 is positioned directly on the back surface of the substrate 110 in the overlap area between the back electrode current collector 152 (152a to 152c) and the back electrode 151. Further, the conductor 52 (52a and 52b) or the back electrode current collector 152c is positioned inside the plurality of openings 181 and on a portion of the upper surface of the back electrode 151. In this instance, the conductor 52 (52a and 52b) or the back electrode current collector 152c is formed on the back electrode 151 having the formation area greater than the conductor 52 (52a and 52b) or the back electrode current collector 152c. Hence, a design margin is increased. As a result, the defect rate of the solar cell is reduced.

As described above, the plurality of solar cells 11 each including the back electrode part 150 capable of having the various structures are connected in series to one another using ribbons, for example, the conductive films 71 to form a solar cell module. The solar cell module is described below with reference to FIG. 18.

Figure 18:
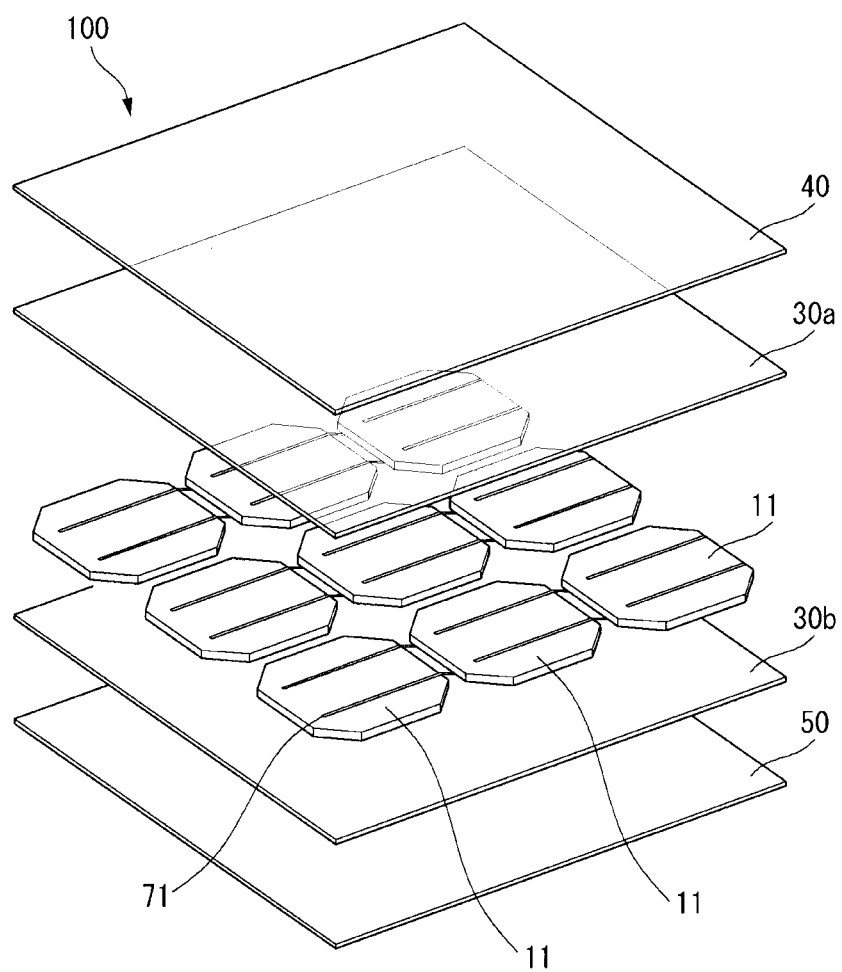
FIG. 18 is an exploded perspective view of a solar cell module manufactured using solar cells according to exemplary embodiments of the invention.

As shown in FIG. 18, a solar cell module 100 includes the plurality of solar cells 11, the plurality of conductive films 71 for electrically connecting the plurality of solar cells 11, front and back protective layers 30a and 30b for protecting the solar cells 11, a transparent member 40 on the upper protective layer 30a positioned on light receiving surfaces of the solar cells 11, a back sheet 50 positioned under the lower protective layer 30b positioned on surfaces, opposite the light receiving surfaces, on which light is not incident.

The back sheet 50 prevents moisture and oxygen from penetrating into the back surfaces of the solar cells 11, thereby protecting the solar cells 11 from the external environment. The back sheet 50 may have a multi-layered structure including a moisture/oxygen penetrating prevention layer, a chemical corrosion prevention layer, an insulation layer, etc.

In case of bifacial solar cells, a glass or resin substrate with light transparency may be used instead of the back sheet 50.

The front and back protective layers 30a and 30b form an integral body along with the plurality of solar cells 11 when a lamination process is performed in a state where the front and back protective layers 30a and 30b are respectively positioned on and under the solar cells 11. The front and back protective layers 30a and 30b prevent corrosion of metal resulting from moisture penetration and protect the solar cells 11 from an impact. The front and back protective layers 30a and 30b may be formed of ethylene vinyl acetate (EVA), etc. Other materials may be used.

The transparent member 40 positioned on the front protective layer 30a is formed of a tempered glass having a high transmittance of light and an excellent damage prevention function. The tempered glass may be a low iron tempered glass containing a small amount of iron. The transparent member 40 may have an embossed inner surface so as to increase a scattering effect of light.

The plurality of solar cells 11 are the solar cells illustrated in FIGS. 1 to 17 and are arranged in a matrix structure as shown in FIG. 18. The number of solar cells 11 in column and/or row directions may vary, if necessary or desired.

Figure 19:
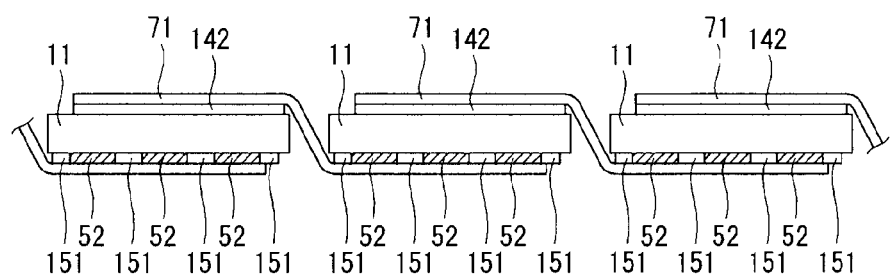
FIG. 19 schematically illustrates an electrical connection structure of a plurality of solar cells of the solar cell module shown in FIG. 18.

As shown in FIG. 19, the plurality of solar cells 11 are electrically connected to one another using the conductive films 71.

More specifically, as shown in FIG. 19, after the plurality of solar cells 11 are arranged in the matrix structure, the front electrode current collector 142 positioned on the front surface of one of the two adjacent solar cells 11 is connected to the back electrode current collector 152 positioned on the back surface of the other solar cell 11 using the conductive film 71. In this instance, because the conductive film 71 has the conductivity, the two adjacent solar cells 11 are electrically connected in series to each other using the conductive film 71.

The solar cell 11 shown in FIG. 19 has the structure in which the back electrode 151 and the back electrode current collector 152 do not overlap each other and abut each other in the extension direction of the conductive film 71 similar to FIG. 6.

Further, the solar cell module 100 shown in FIG. 19 may use the solar cells 11 each having the back electrode part 150 illustrated in FIGS. 3 to 5 and FIGS. 7 to 17.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
a semiconductor substrate;
an emitter region which is positioned at the semiconductor substrate and forms a p-n junction along with the semiconductor substrate;
a first electrode which is positioned on the semiconductor substrate and is connected to the emitter region;
a second electrode which is positioned on the semiconductor substrate and is connected to the semiconductor substrate; and
a second electrode current collector which is positioned on the semiconductor substrate and is connected to the second electrode,
wherein the second electrode current collector includes a plurality of conductors which are separated from one another and parallel to one another along a first direction which is an extension direction of a conductive film positioned on the second electrode current collector,
wherein the second electrode has a plurality of openings in which a portion of each of the plurality of conductors is exposed,
wherein the conductive film is positioned on the plurality of conductors exposed through the plurality of openings of the second electrode,
wherein edge portions of each of the plurality of conductors including a plurality of first portions parallel to the first direction and a plurality of second portions parallel to a second direction crossing the first direction, and
wherein at least one of the plurality of second portions does not overlap with a portion of the second electrode parallel to the second direction and are not separated from one another, and a side surface of the second portion and a side surface of the second electrode contact each other.

2. The solar cell of claim 1, wherein an overlap distance between the second electrode and the first portion is about 0.25 mm, and an overlap distance between the second electrode and the second portion is about 0.5 mm.

3. The solar cell of claim 1, wherein an edge portion of the at least one conductor of the plurality of conductors includes a first portion overlapping the second electrode in the second direction and a second portion which does not overlap the second electrode in the first direction and is separated from or abuts the second electrode in the first direction.

4. The solar cell of claim 3, wherein a distance between an end of the second portion and an end of the second electrode adjacent to the end of the second portion is equal to or less than about 0.25 µm.

5. The solar cell of claim 3, wherein an overlap distance between the second electrode and the first portion is about 0.25 mm to 0.5 mm.

6. The solar cell of claim 1, wherein at least one conductor of the plurality of conductors has a plurality of first branches which are separated from one another and protrude in the second direction,
wherein the second electrode overlaps the plurality of branches.

7. The solar cell of claim 6, wherein the at least one conductor of the plurality of conductors further has a plurality of second branches which are separated from one another and protrude in the first direction,
wherein the second electrode overlaps the plurality of second branches.

8. The solar cell of claim 7, wherein a length of the plurality of first branches is longer than a length of the plurality of second branches.

9. The solar cell of claim 8, wherein a width of the plurality of first branches is equal to or greater than a width of the plurality of second branches.

10. The solar cell of claim 7, wherein the second electrode current collector has a plurality of first branches which are separated from one another and protrude in the second direction,
wherein the second electrode overlaps the plurality of first branches.

11. The solar cell of claim 10, wherein the second electrode current collector further has a plurality of second branches which are separated from one another and protrude in the first direction,
wherein the second electrode overlaps the plurality of second branches.

12. The solar cell of claim 11, wherein a length of the plurality of first branches is longer than a length of the plurality of second branches.

13. The solar cell of claim 12, wherein a width of the plurality of first branches is equal to or greater than a width of the plurality of second branches.

14. The solar cell of claim 1, wherein the second electrode current collector is positioned directly on the semiconductor substrate, wherein a portion of the second electrode is positioned on a portion of the second electrode current collector and overlaps the portion of the second electrode current collector.

15. The solar cell of claim 1, wherein a portion of the second electrode current collector is positioned on a portion of the second electrode positioned directly on the semiconductor substrate and overlaps the portion of the second electrode.

16. A solar cell module comprising:
    first and second solar cells each including a substrate, an emitter region positioned at the substrate, a plurality of first electrodes which are positioned on a first surface of the substrate and are connected to the emitter region, a first electrode current collector which is positioned on the first surface of the substrate and are connected to the plurality of first electrodes, a second electrode which is positioned on the second surface of the substrate opposite the first surface and is connected to the substrate, a second electrode current collector which is positioned on the second surface of the substrate and is connected to the second electrode; and
    a conductive film which is positioned on the first electrode current collector positioned on the first solar cell and on the second electrode current collector positioned on the second solar cell in a first direction corresponding to an extension direction of the first and second electrode current collectors and connects the first and second solar cells to each other,
    wherein the first and second electrode current collectors of each of the first and second solar cells extend in the first direction, and the plurality of first electrodes of each of the first and second solar cells extend in a second direction crossing the first direction, and
    wherein the second electrode current collector includes a plurality of conductors which are separated from one another and parallel to one another along a first direction which is an extension direction of a conductive film positioned on the second electrode current collector,
    wherein the second electrode has a plurality of openings in which a portion of each of the plurality of conductors is exposed,
    wherein the conductive film is positioned on the plurality of conductors exposed through the plurality of openings of the second electrode,
    wherein edge portions of each of the plurality of conductors include a plurality of first portions parallel to the first direction and a plurality of second portions parallel to a second direction crossing the first direction,
    wherein the plurality of first portions is overlapped with the second electrode, and
    wherein at least one of the plurality of second portions does not overlap with a portion of the second electrode parallel to the second direction and are not separated from one another, and a side surface of the second portion and a side surface of the second electrode contact each other.

* * * * *